(12) United States Patent
Wang

(10) Patent No.: US 10,886,298 B2
(45) Date of Patent: Jan. 5, 2021

(54) METHOD OF FORMING A MEMORY DEVICE

(71) Applicant: Chen-Chih Wang, New Taipei (TW)

(72) Inventor: Chen-Chih Wang, New Taipei (TW)

( * ) Notice: Subject to any disclaimer, the term of this patent is extended or adjusted under 35 U.S.C. 154(b) by 0 days.

(21) Appl. No.: 16/826,287

(22) Filed: Mar. 22, 2020

(65) Prior Publication Data

US 2020/0227436 A1 Jul. 16, 2020

Related U.S. Application Data

(62) Division of application No. 16/053,823, filed on Aug. 3, 2018, now Pat. No. 10,644,024.

(60) Provisional application No. 62/574,758, filed on Oct. 20, 2017.

(51) Int. Cl.
| | |
|---|---|
| *H01L 21/8246* | (2006.01) |
| *H01L 27/11582* | (2017.01) |
| *H01L 27/11565* | (2017.01) |
| *H01L 27/1157* | (2017.01) |
| *H01L 27/11556* | (2017.01) |
| *H01L 27/11504* | (2017.01) |
| *H01L 27/105* | (2006.01) |
| *H01L 21/8234* | (2006.01) |
| *H01L 27/11568* | (2017.01) |

(52) U.S. Cl.
CPC .... *H01L 27/11582* (2013.01); *H01L 27/1157* (2013.01); *H01L 27/11504* (2013.01); *H01L 27/11556* (2013.01); *H01L 27/11565* (2013.01); *H01L 21/823481* (2013.01); *H01L 21/823487* (2013.01); *H01L 27/1052* (2013.01); *H01L 27/11568* (2013.01)

(58) Field of Classification Search
CPC ..... H01L 21/823481; H01L 21/823487; H01L 27/1052; H01L 27/11568
See application file for complete search history.

(56) References Cited

U.S. PATENT DOCUMENTS

| | | | |
|---|---|---|---|
| 9,406,692 B2 | 8/2016 | Lee | |
| 10,192,878 B1 | 1/2019 | Tsutsumi et al. | |
| 2002/0028541 A1 | 3/2002 | Lee et al. | |
| 2011/0169067 A1 | 7/2011 | Ernst et al. | |
| 2015/0380419 A1 | 12/2015 | Gunji-Yoneoka et al. | |
| 2017/0133389 A1 | 5/2017 | Yun et al. | |
| 2017/0294445 A1 | 10/2017 | Son et al. | |
| 2019/0066818 A1 | 2/2019 | Lee et al. | |
| 2020/0203429 A1* | 6/2020 | Fantini | H01L 27/2481 |

(Continued)

FOREIGN PATENT DOCUMENTS

| | | |
|---|---|---|
| CN | 102157568 A | 8/2011 |
| CN | 102986028 A | 3/2013 |
| CN | 103871892 A | 6/2014 |

(Continued)

*Primary Examiner* — George R Fourson, III
(74) *Attorney, Agent, or Firm* — CKC & Partners Co., LLC

(57) ABSTRACT

A method of forming a memory device including forming a stack of silicon nitride layers and polysilicon layers that are alternating arranged, etching a serpentine trench in the stack of silicon nitride layers and polysilicon layers, forming a first isolation layer in the serpentine trench, removing one of the silicon nitride layers to form a recess between neighboring two of the polysilicon layers, and forming in sequence a doped polysilicon layer, a gate dielectric layer, and a conductive layer in the recess.

6 Claims, 45 Drawing Sheets

(56) References Cited

U.S. PATENT DOCUMENTS

2020/0303464 A1\* 9/2020 Fantini ................ H01L 45/1675

FOREIGN PATENT DOCUMENTS

| CN | 104969351 A | 10/2015 |
| --- | --- | --- |
| JP | H05291583 A | 11/1993 |
| JP | 2014140054 A | 7/2014 |
| JP | 2017050527 A | 3/2017 |

\* cited by examiner

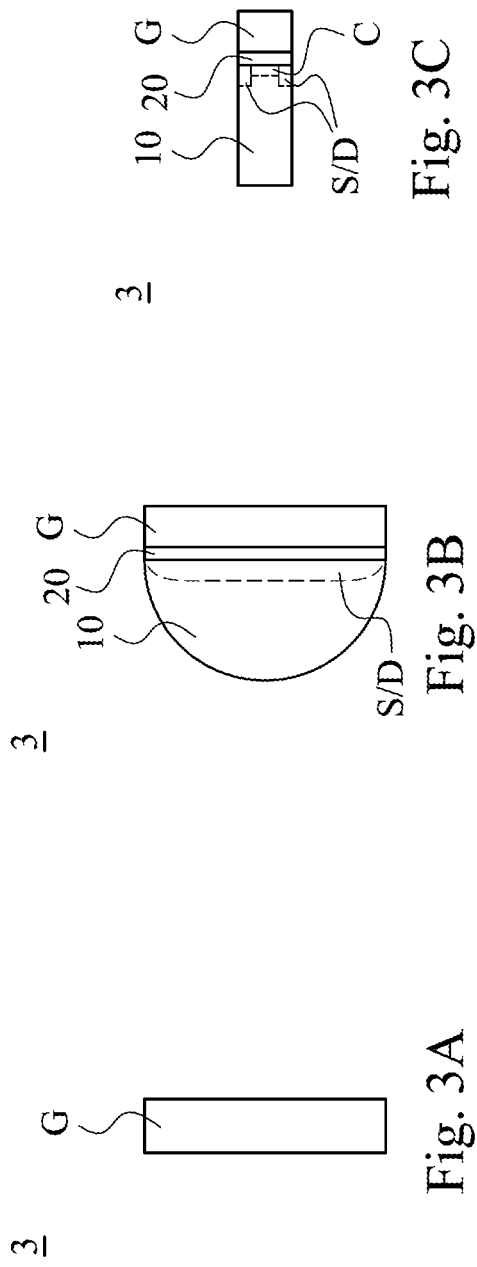

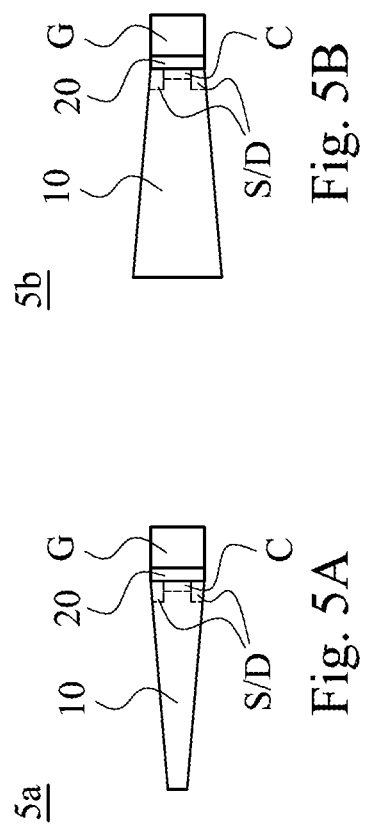

METHOD OF FORMING A MEMORY DEVICE

RELATED APPLICATIONS

This application is a Divisional Application of the U.S. application Ser. No. 16/053,823, filed on Aug. 3, 2018, which claims priority of U.S. Provisional Application Ser. No. 62/574,758, filed on Oct. 20, 2017, the entirety of which is incorporated by reference herein in their entireties.

BACKGROUND

Technical Field

The present disclosure relates to a method of forming a memory device. More particularly, the present disclosure relates to a method of forming a three-dimension (3D)-NAND flash memory device.

Description of Related Art

Semiconductor memory devices may be classified into two categories, volatile memory devices and nonvolatile memory devices. In contrast to volatile memory devices, nonvolatile memory devices are widely used in solid state devices (SSD) and cloud storage because nonvolatile memory devices do not require power to retain data. Flash memory is a type of nonvolatile memory devices and has various advantages, such as high integration, fast access speed, easy to program, erase and read. In order to further increase the bit density in flash memory and to lower bit cost, a 3D-NAND flash memory has emerged as a promising candidate in a future nonvolatile memory device.

SUMMARY

According to some embodiments, a method of forming a memory device including forming a stack of silicon nitride layers and polysilicon layers that are alternating arranged, etching a serpentine trench in the stack of silicon nitride layers and polysilicon layers, forming a first isolation layer in the serpentine trench, removing one of the silicon nitride layers to form a recess between neighboring two of the polysilicon layers, and forming in sequence a doped polysilicon layer, a gate dielectric layer, and a conductive layer in the recess.

In some embodiments, the method of forming a memory device further includes etching a stripe-shaped trench in the stack of silicon nitride layers and polysilicon layers, and forming a second isolation layer in the stripe-shaped trench after forming the doped polysilicon layer, the gate dielectric layer, and the conductive layer.

In some embodiments, forming a second isolation layer in the stripe-shaped trench, such that the doped polysilicon layer faces toward the second isolation layer.

In some embodiments, forming the conductive layer is performed such that a first portion of the conductive layer and a second portion of the conductive layer wrap around the doped polysilicon layer in top view, and the first isolation layer is between the first portion and the second portion of the conductive layer in top view.

In some embodiments, forming the doped polysilicon layer, the gate dielectric layer and the conductive layer in the recess, such that the doped polysilicon layer has a semi-elliptical profile in top view.

In some embodiments, a conductive layer is formed as embedded in the gate dielectric layer.

Embodiments of the present disclosure offer advantages, though it is understood that other embodiments may offer different advantages, not all advantages are necessarily discussed herein, and no particular advantage is required for all embodiments.

It is to be understood that both the foregoing general description and the following detailed description are by examples, and are intended to provide further explanation of the invention as claimed.

BRIEF DESCRIPTION OF THE DRAWINGS

Embodiments of the present disclosure can be more fully understood by reading the following detailed description of the embodiment, with reference made to the accompanying drawings as follows.

FIG. 3A is a side view of another FanFET in accordance with some embodiments of the present disclosure, FIG. 3B is a top view of the FanFET as shown in FIG. 3A, and FIG. 3C is a cross-sectional view of the FanFET as shown in FIG. 3A.

FIGS. 4A, 4B, 4C, 5A, 5B, 6A, 6B and 6C are cross-sectional views of FanFETs in accordance with some embodiments of the present disclosure.

DETAILED DESCRIPTION

Figure 1C:
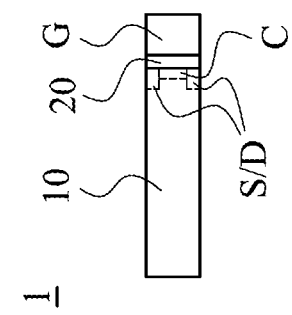
FIG. 1C is a cross-sectional view of the FanFET as shown in FIG. 1A.

Reference will now be made in detail to the present embodiments of the invention, examples of which are illustrated in the accompanying drawings. Wherever possible, the same reference numbers are used in the drawings and the description to refer to the same or like parts.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
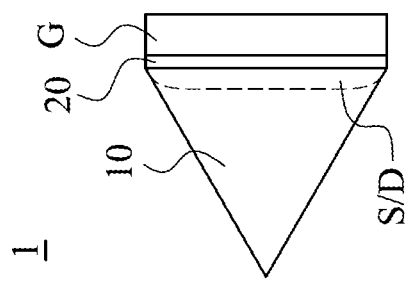
FIG. 1B is a top view of the FanFET as shown in FIG. 1A.
Figure 1A:
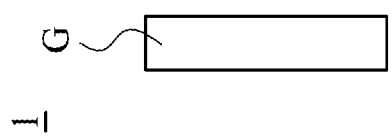
FIG. 1A is a side view of a fan structure field effect transistor (FanFET) in accordance with some embodiments of the present disclosure.
Figure 2C:
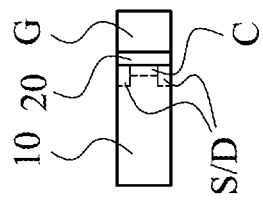
FIG. 2C is a cross-sectional view of the FanFET as shown in FIG. 2A.
Figure 2B:
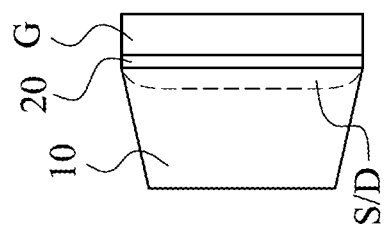
FIG. 2B is a top view of the FanFET as shown in FIG. 2A.
Figure 2A:
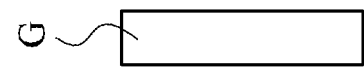
FIG. 2A is a side view of another FanFET in accordance with some embodiments of the present disclosure.

FIGS. 1A to 1C, 2A to 2C, and 3A to 3C are various types of the fan structure field effect transistor (FanFET). FanFET is applied for integrated circuits of transistor and memory cell. FIGS. 1A, 2A, and 3A are side views of various types of FanFET in accordance with some embodiments of the present disclosure. FIGS. 1B, 2B, and 3B each are top views of various types of FanFET in accordance with some embodiments of the present disclosure. FIGS. 1C, 2C, and 3C are cross-sectional views of various types of FanFET in accordance with some embodiments of the present disclosure.

Referring to FIGS. 1A-1C, a FanFET 1 includes a substrate 10, source/drain regions S/D and a channel region C in the substrate 10, a gate G and a dielectric layer 20 (referred to as a gate dielectric layer in this context) between the gate G and the substrate 10. The substrate 10 tapers in a direction away from the dielectric layer 20. For example, in the embodiments as illustrated in FIG. 1B, the shape of the substrate 10 may be equilateral triangle, acute triangle and obtuse triangle in top view in some embodiments. The channel region C is between the source/drain regions S/D and doped with a dopant of a different type from that of the source/drain regions S/D. Optionally, a region of the substrate 10 that is away from the channel region C and the source/drain regions S/D can be doped with a suitable dopant. The dielectric layer 20 is in contact with a sidewall proximate the source/drain regions S/D and the channel region C in the substrate 10. The gate G is in contact with the dielectric layer 20.

In some embodiments, the substrate 10 is made of, for example, polysilicon. The source/drain regions S/D are doped with an n-type dopant (e.g., phosphorus or arsenic) or a p-type dopant (e.g., boron). The channel region C is doped with a dopant of a different conductivity from the source/drain regions S/D. A region of the substrate 10 that is away from the channel region C and the source/drain regions S/D can be optionally doped with the same dopant as the channel region C.

In some embodiments, the dielectric layer 20 is a single-layered film or a multi-layered film. For example, the dielectric layer 20 is a single oxide layer in some embodiments, and in other embodiments, the dielectric layer 20 is a two-layered film made of an oxide layer (referred to a tunnel oxide in some embodiments) and a nitride layer between the oxide layer and the gate G. In some embodiments, the dielectric layer 20 is a high-k dielectric layer or a combination with a multi-layered film. For example, the dielectric layer 20 may include one layer of metal oxide or a silicate of Hf, Al, Zr, combinations thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_5$, $Y_2O_3$, $HfO_2$, $ZrO_2$, HfSiON, $YGe_xO_y$, $YSi_xO_y$ and $LaAlO_3$, and the like.

In some embodiments, the gate G is made of a conductive material, such as doped polysilicon, tantalum nitride (TaN), other conductive nitride, tungsten, other metal or combinations thereof. For example, the gate G is made of TaN.

FIGS. 2A-2C illustrate another FanFET, FanFET 2, which shares many features of FanFET 1, except for a shape of the substrate 10. In some embodiments as illustrated in FIGS. 2A-2C, the shape of the substrate 10 is trapezoidal in top view in some embodiments. In greater detail, the substrate 10 includes a long base in contact with the dielectric layer 20 and a short base that is shorter than the long base and distal from the dielectric layer 20. As a result of the trapezoidal shape, the substrate 10 as illustrated in FIG. 2B tapers in a direction away from the dielectric layer 20 as well.

FIGS. 3A-3C illustrate another FanFET, FanFET 3, which shares many features of FanFET 1, except for a shape of the substrate 10. In some embodiments as illustrated in FIGS. 3A-3C, the shape of the substrate 10 is semi-sphere, semi-elliptical, semi-cylinder, semi-ellipsoid, semi-ellipsoid cylinder-like (SECL), and the like in some embodiments. As a result of the semi-sphere shape, the substrate 10 as illustrated in FIG. 3B tapers in a direction away from the dielectric layer 20 as well.

Figure 4C:
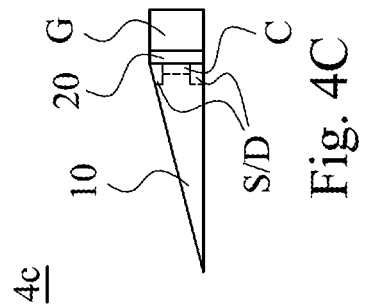
Figure 4B:
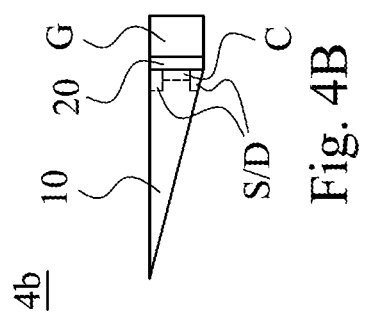
Figure 4A:
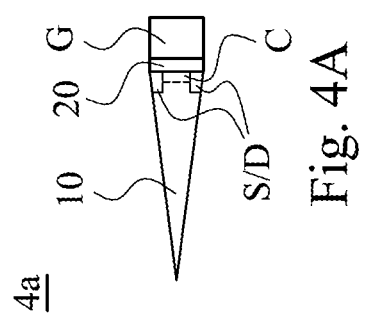

FIGS. 4A to 4C, 5A to 5B, 6A to 6C, and 7 are various types of FanFETs in accordance with some embodiments of the present disclosure. FIG. 4A illustrates another FanFET, FanFET 4a, which shares many features of FanFETs 1, 2, and/or 3 as illustrated in FIGS. 1A-1C, 2A-2C and 3A-3C, except for a shape of the substrate 10 in cross-sectional view. In some embodiments as illustrated in FIG. 4A, the shape of the substrate 10 is triangle in cross-sectional view. In greater detail, the triangular substrate 10 has two sloped sides meeting at a pointed end farthest from the dielectric layer 20 in cross-sectional view. FIG. 4B illustrates another FanFET, FanFET 4b, which shares many features of FanFET 4a, except for a shape of the substrate 10 in cross-sectional view. In greater detail, the triangular substrate 10 has a substantially straight side and a sloped side meeting at a pointed end farthest from the dielectric layer 20, and the substantially straight side is in a position higher than the sloped side in cross-sectional view. FIG. 4C illustrates another FanFET, FanFET 4c, which shares many features of FanFET 4b, except for a shape of the substrate 10 in cross-sectional view. In greater detail, the triangular substrate 10 has a substantially straight side and a sloped side meeting at a pointed end farthest from the dielectric layer 20 in cross-sectional view, and the substantially straight side is in a position lower than the sloped side in cross-sectional view.

FIG. 5A illustrates another FanFET, FanFET 5a, which shares many features of FanFETs 1, 2 and/or 3 as illustrated in FIGS. 1A-1C, 2A-2C and 3A-3C, except for a shape of the substrate 10 in cross-sectional view. In some embodiments as illustrated in FIG. 5A, the shape of the substrate 10 is trapezoidal in cross-sectional view. In greater detail, the trapezoidal substrate 10 has a long base in contact with the dielectric layer 20 and a short base farthest from the dielectric layer 20 in cross-sectional view. It is understood that if the FanFET 5a has a top view profile as illustrated in FIG. 1B or 3B, the short base of the trapezoidal substrate 10 in cross-sectional view resembles a line in a perspective view. On the contrary, if the FanFET 5a has a top view profile as illustrated in FIG. 2B, the short base of the of the trapezoidal substrate 10 in cross-sectional view resembles a surface in a perspective view.

FIG. 5B illustrates another FanFET, FanFET 5b, which shares many features of FanFET 5a, except for a shape of the substrate 10 in cross-sectional view. In greater detail, the trapezoidal substrate 10 as illustrated in FIG. 5B has a short base in contact with the dielectric layer 20 and a long base farthest from the dielectric layer 20. It is understood that if the FanFET 5b has a top view profile as illustrated in FIG. 1B or 3B, the long base of the trapezoidal substrate 10 in cross-sectional view resembles a line in a perspective view. On the contrary, if the FanFET 5b has a top view profile as illustrated in FIG. 2B, the long base of the trapezoidal substrate 10 in cross-sectional view resembles a surface in perspective view.

Figure 6C:
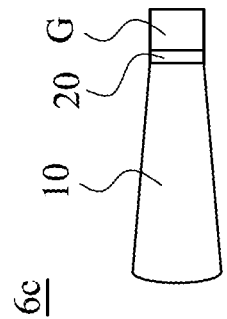
Figure 6B:
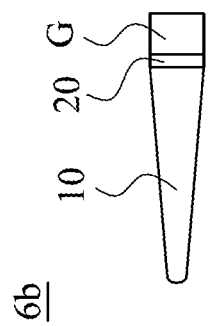
Figure 6A:
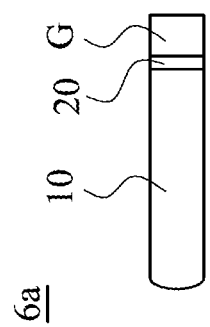

FIG. 6A illustrates another FanFET, FanFET 6a, which shares many features of FanFETs 1, 2 and/or 3 as illustrated in FIGS. 1A-1C, 2A-2C and 3A-3C, except for a shape of the substrate 10 in cross-sectional view. In some embodiments as illustrated in FIG. 6A, the substrate 10 has a curved end farthest from the dielectric layer 20 in cross-sectional view. FIG. 6B illustrates another FanFET, FanFET 6b, which shares many features of FanFET 6a, except for a shape of the substrate 10 in cross-sectional view. In greater detail, the substrate 10 tapers in a direction away from the dielectric layer 20 and also has a curved end farthest from the dielectric layer 20 in cross-sectional view. FIG. 6C illustrates another FanFET, FanFET 6c, which shares many features of FanFET 6a, except for a shape of the substrate 10 in cross-sectional view. In greater detail, the substrate 10 tapers in a direction toward the dielectric layer 20 and also has a curved end farthest from the dielectric layer 20 in cross-sectional view.

Figure 7:
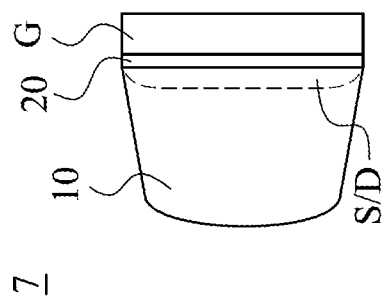
FIG. 7 is a top view of a FanFET in accordance with some embodiments of the present disclosure.

FIG. 7 illustrates another FanFET, FanFET 7, which shares many features of FanFETs 1, 2, 3, 4a-4c, 5a-5b, and/or 6a-6c as illustrated in FIGS. 1A-1C, 2A-2C, 3A-3C, 4A-4C, 5A-5B and 6A-6C, except for a shape of the substrate 10 in top view. In some embodiments as illustrated in FIG. 7, the substrate 10 tapers in a direction away from the dielectric layer 20 and further has a curved end in top view.

It is understood that all geometries illustrated in FIGS. 1A-1C, 2A-2C, 3A-3C, 4A-4C, 5A-5B, 6A-6C and 7 are only examples of the FanFET, not limiting the claimed scope. Any other variation of the FanFET should be included in the claimed scope.

Figure 8:
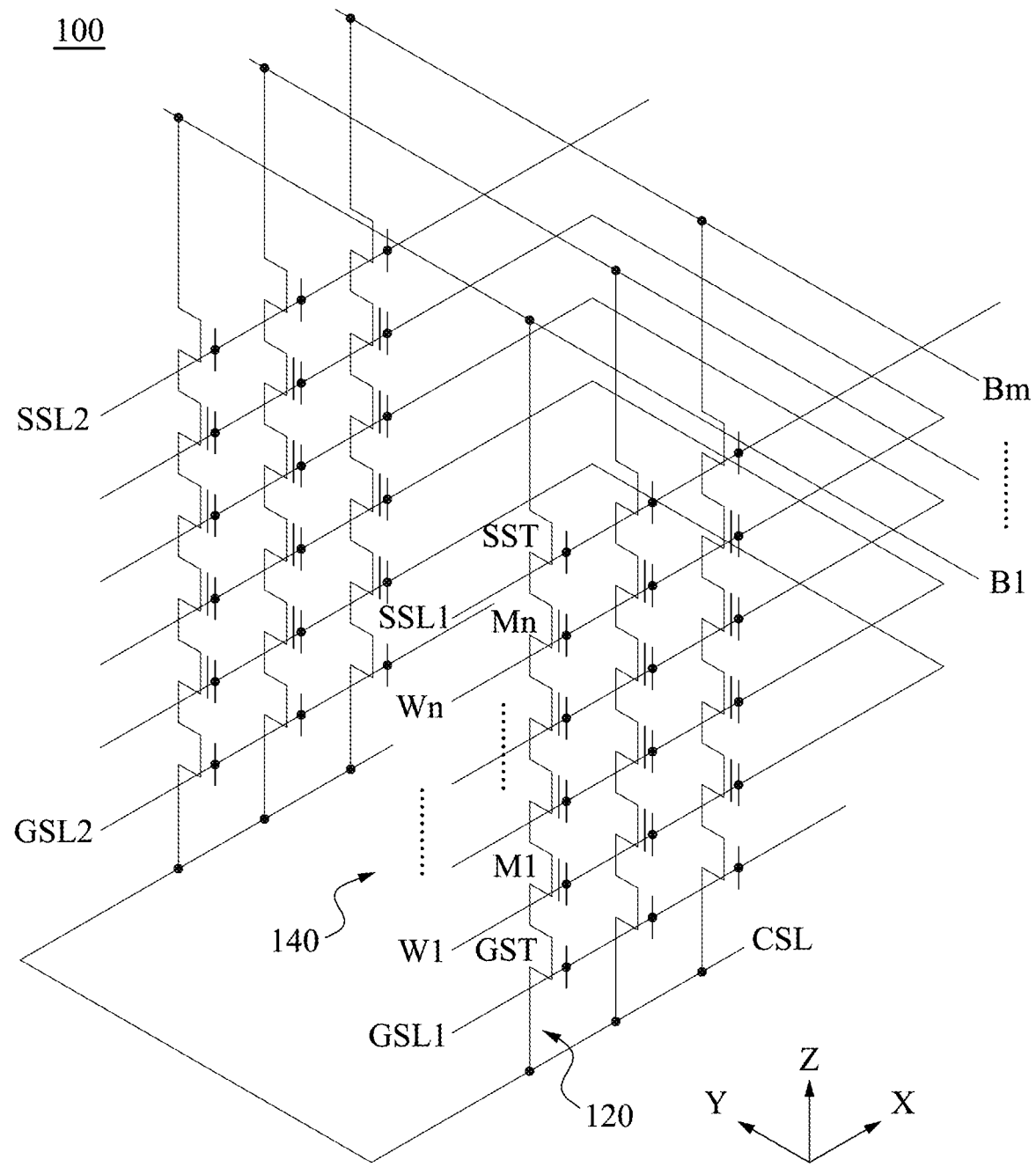
FIG. 8 is an equivalent circuit diagram of a memory cell array of a nonvolatile memory device in accordance with some embodiments of the present disclosure.

FIG. 8 is an equivalent circuit diagram of memory cell array 100 of a nonvolatile memory device in accordance with some embodiments of the present disclosure. In greater detail, FIG. 8 is an equivalent circuit diagram of a 3D-NAND flash memory device having a vertical channel (VC) structure.

Referring to FIG. 8, the memory cell array 100 includes a plurality of memory cell strings 120 in a vertical direction, i.e., Z direction. A plurality of memory cell strings 120 may constitute a memory cell block 140 which is connected to a plurality of word lines W1 to Wn. Each of the memory cell strings 120 may include a string selection transistor SST, a plurality of memory cells M1 to Mn, and a ground selection transistor GST. The string selection transistor SST, the plurality of memory cells M1 to Mn, and the ground selection transistor GST may be disposed in series in the Z direction. The plurality of word lines W1 to Wn may be respectively connected to the plurality of memory cells M1 to Mn, so as to control the respective memory cells M1 to Mn. The number of memory cells M1 to Mn may be adjusted according to the capacity of a semiconductor memory device.

A plurality of bit lines B1 to Bm extending in the Y direction may be connected to a top side of the memory cell strings 120 at first column to mth column, for example, to a drain of the string selection transistor SST. Moreover, a common source line CSL may be connected to a bottom side of the memory cell strings 120, for example, to a source of ground selection transistor GST. In some embodiments, each memory cell string 120 may include a plurality of memory cells (for example, from 4 memory cells to 8192 memory cells). The above number of the memory cells is only exemplary, not used to limit the claimed scope.

A word line extending in the X direction may be connected in common to gate electrodes of memory cells arranged in the same layer (for example, the memory cells arranged in the same layer as M1), among the memory cells M1 to Mn of the memory cell strings 120. According to the driving of the word lines W1 to Wn, data may be programmed/read or erased into/from the memory cells M1 to Mn.

The string selection transistor SST may be disposed between the bit line (for example, B1) and the uppermost memory cell Mn in each memory cell string 120. Each string selection transistor SST in the memory cell block 140 may control data transmission between the bit lines B1 to Bm and the memory cells M1 to Mn by a string selection line SSL connected to the gate of the string selection transistor SST.

The ground selection transistor GST may be disposed between the lowermost memory cell M1 and the common source line CSL. Each ground selection transistor GST in the memory cell block 140 may control data transmission between the common source line CSL and the memory cells M1 to Mn by a ground selection line GSL connected to a gate of the ground selection transistor GST.

Figure 9:
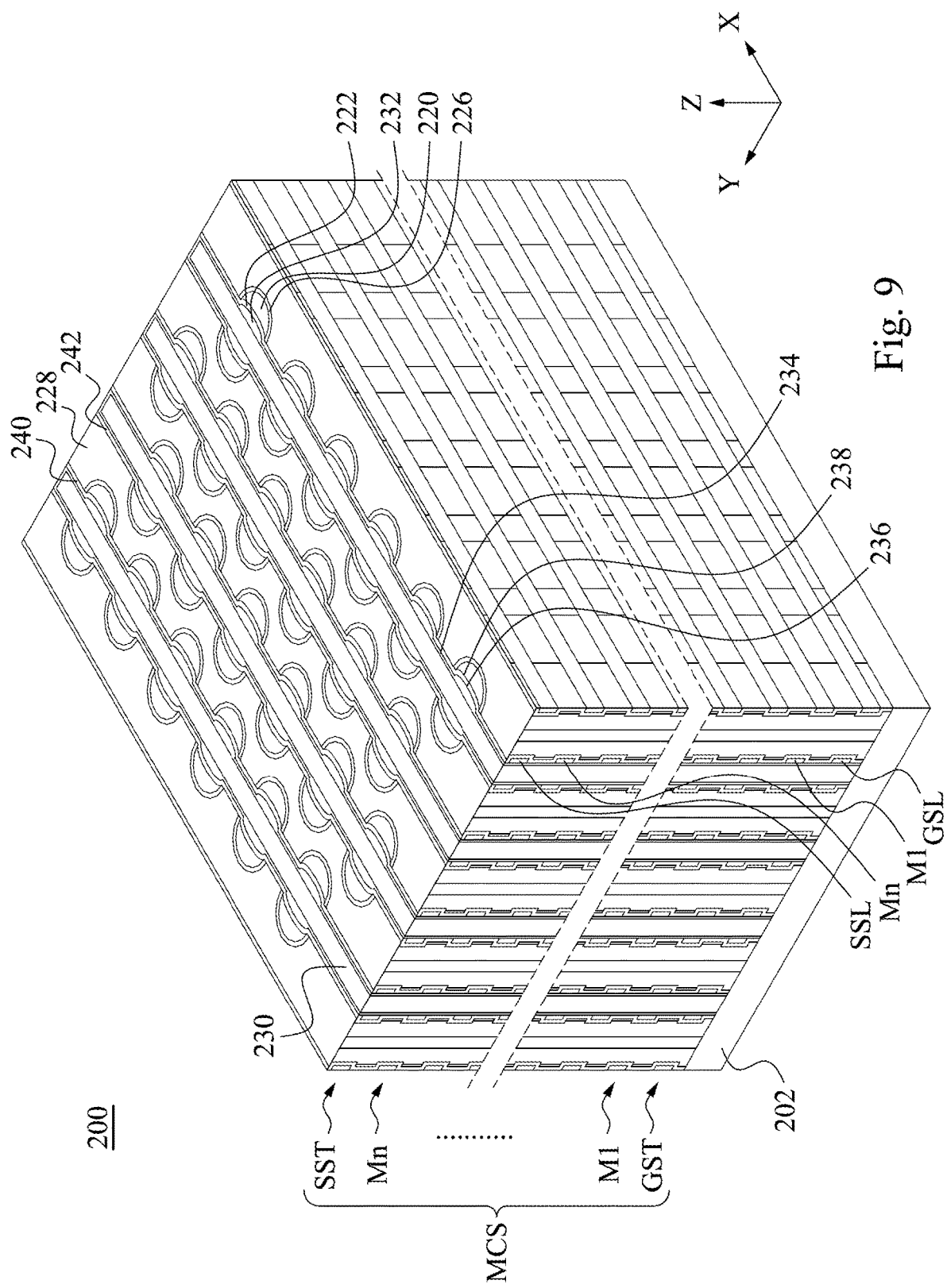
FIGS. 9 to 11 are schematic perspective views of a 3D structure of memory cell strings of a nonvolatile memory device in accordance with some embodiments of the present disclosure.
Figure 10:
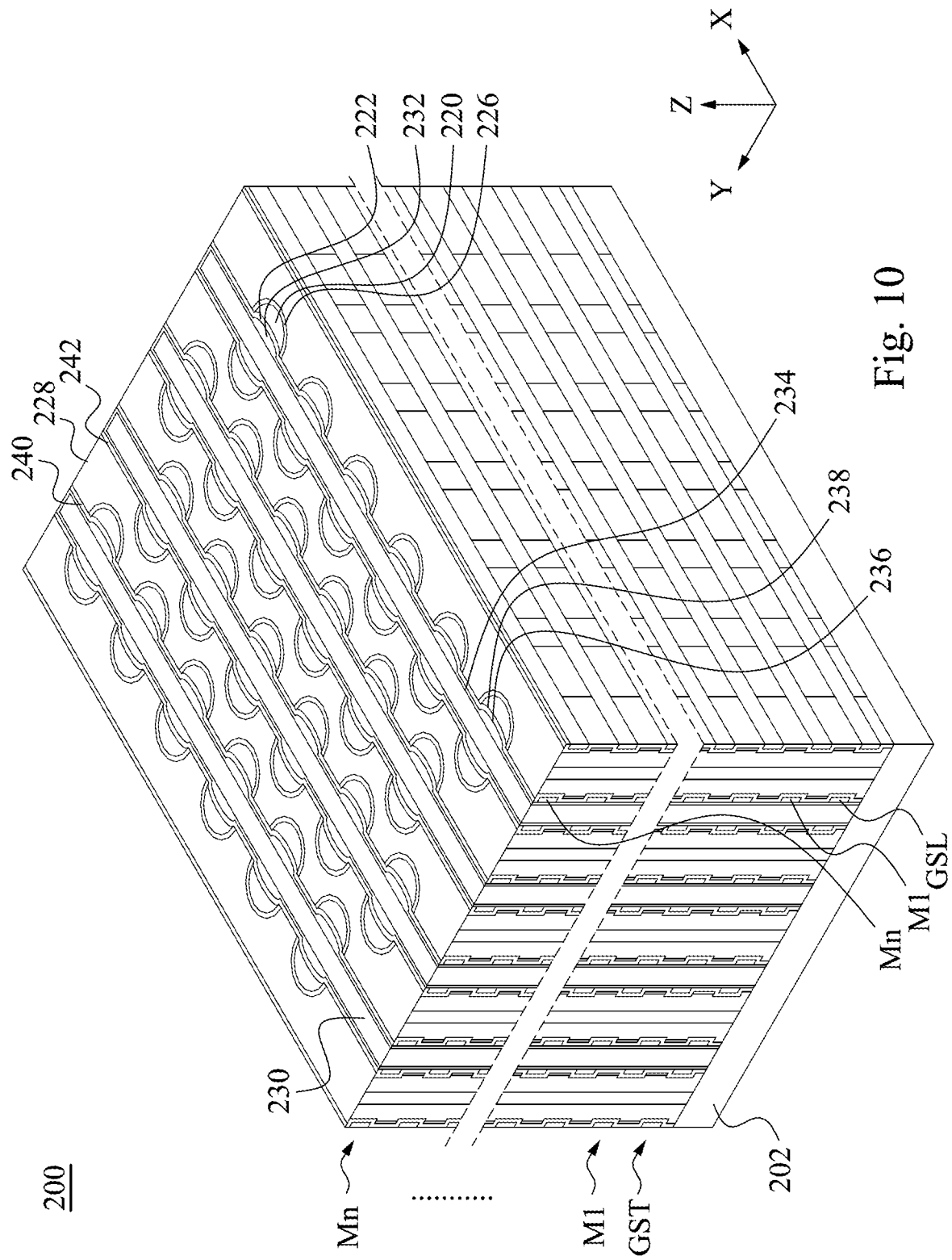
Figure 11:
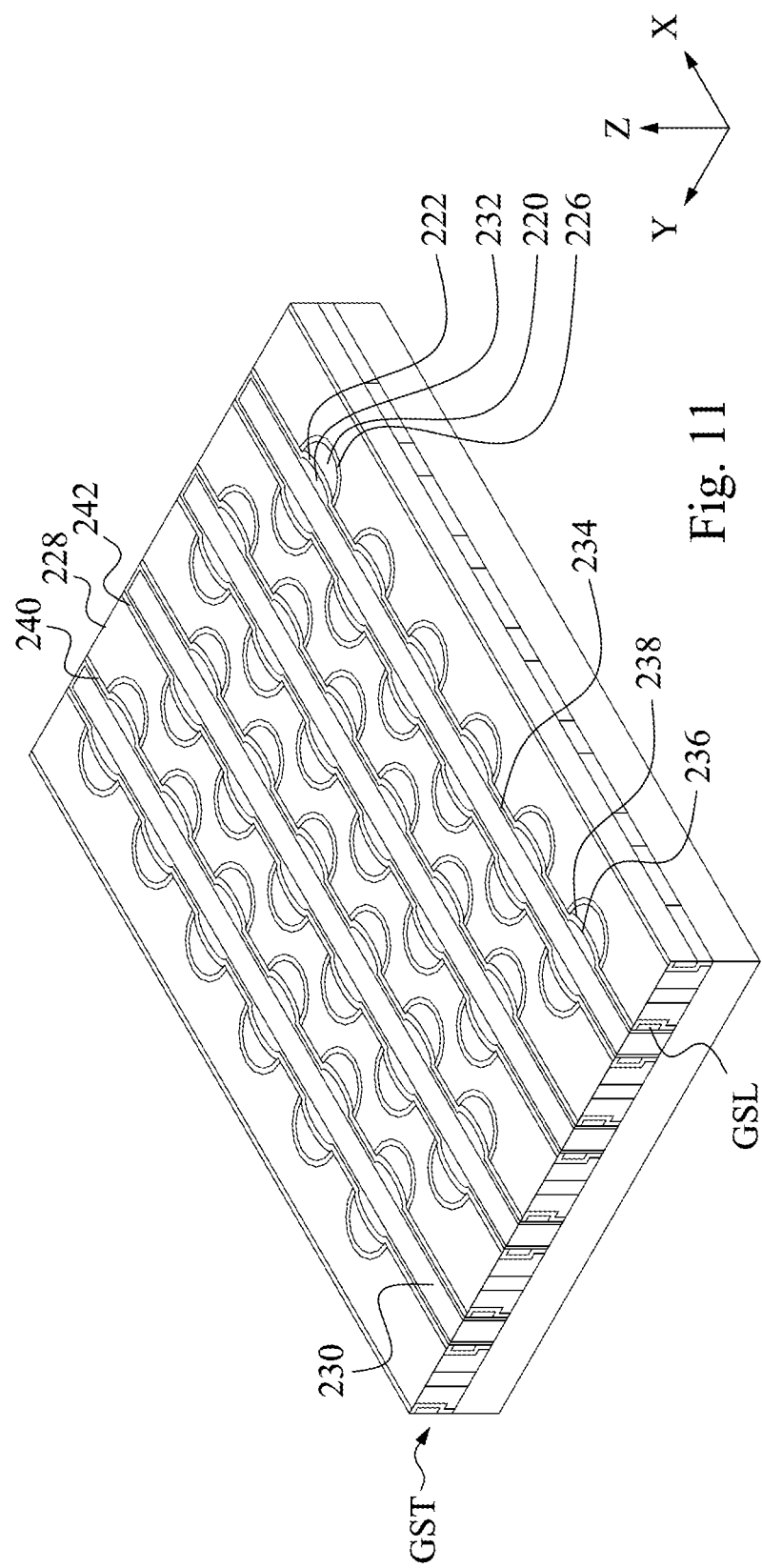

FIGS. 9 to 11 are schematic perspective views of memory cell strings 120 (shown in FIG. 8) of a nonvolatile memory device 200 in accordance with some embodiments of the present disclosure. In particular, FIG. 9 illustrates strings of ground selection transistor GST, memory cells M1 to Mn and string selection transistor SST, FIG. 10 illustrates substantially the same structure as FIG. 9 except for omission of the string selection transistors SST, and FIG. 11 illustrates substantially the same structure as FIG. 9, except for omission of the string selection transistors SST and memory cells M1 to Mn. In FIGS. 9 to 11, the illustrations of some elements constituting the memory cell strings 120 of FIG. 8 are omitted.

Referring to FIG. 9, the nonvolatile memory device 200 may include a plurality of memory cell strings MCS each including a vertical channel 220 extending in the Z direction. The vertical channels 220 each have a string of memory cell with semi-ellipsoid cylinders-like shape. The plurality of memory cell strings MCS extending in the Z direction from the substrate 202 and arranged along the X-Y plane. The memory cell strings MCS correspond to the memory cell strings 120 of FIG. 8. Each memory cell strings MCS may include a ground selection transistor GST, a plurality of memory cells M1 to Mn, and a string selection transistor SST. Ground selection lines GSL, word lines W1 to Wn, and string selection lines SSL that are electrically connected to the memory cell strings MCS are illustrated as well.

A main surface of the substrate 202 may extend in the X-Y plane. The substrate 202 is a silicon substrate in the present embodiment. Alternatively, the substrate 202 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor-on-insulator (SOI) such as having a buried layer.

The vertical channels 220 having a semi-elliptical profile may extend in the Z direction that is perpendicular to the direction of the main surface of the substrate 202. The vertical channels 220 may be disposed and separated from each other. In greater detail, the vertical channels 220 embedded in opposite sides of an isolation layer 228 are misaligned with each other along the Y direction.

A gate dielectric layer 222 may be embedded in the vertical channels 220. The gate dielectric layer 222 may be placed on X-Y plane and extended in the Z direction, which is perpendicular to the substrate 202. In some embodiments, the gate dielectric layer 222 is a multi-layered film in the memory cells M1-Mn. For example, the gate dielectric layer 222 in the memory cells M1-Mn may be a two-layered film including a silicon oxide layer (referred to as tunnel oxide in some embodiments) and a silicon nitride layer. In some embodiments, the gate dielectric layer 222 in the ground selection transistor GST and the string selection transistor SST is a single-layered film. For example, the gate dielectric layer 222 in the ground selection transistor GST and the string selection transistor SST is a single silicon oxide layer.

In some embodiments, the gate dielectric layer 222 includes silicon oxide, silicon nitride, high-k dielectric materials or combinations thereof. In other embodiments, the gate dielectric layer 222 may include high-k dielectric materials. For example, the gate dielectric layer 222 may include one or more layers of a metal oxide or a silicate of Hf, Al, Zr, combinations thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_5$, $Y_2O_3$, $HfO_2$, $ZrO_2$, HfSiON, $YGe_xO_y$, $YSi_xO_y$ and $LaAlO_3$, and the like. The formation methods of gate dielectric layer 222 may include molecular-beam epitaxy (MBE), atomic layer deposition (ALD), physical vapor deposition (PVD), chemical vapor deposition (CVD) (e.g., metal organic CVD (MOCVD), plasma enhanced CVD (PECVD), atmospheric pressure CVD (APCVD), low-pressure CVD (LPCVD), ultrahigh vacuum CVD (UHCVD), microwave plasma CVD (MPCVD), remote plasma CVD (RPCVD), rapid-thermal CVD (RTCVD)), and the like.

String selection line SSL, word lines W1 to Wn and ground selection line GSL are embedded in different regions of the gate dielectric layer 222 that are vertically arranged, as illustrated in FIGS. 9-11. The string selection line SSL, word lines W1 to Wn and the ground selection line GSL each include embedded portions 232 embedded in the vertical channels 220. In some embodiments, the string selection line SSL, the word lines W1 to Wn, and the ground selection line GSL each further include a plurality of connecting portions 234 alternating arranged with the embedded portions 232. The connecting portions 234 are thinner than the embedded portions 232. In some embodiments, the embedded portions 232 of said one of the word lines W1 to Wn are respectively embedded in a plurality of the vertical channels 220. The word lines W1 to Wn may be a doped polysilicon, or other conductive material such as tantalum nitride or other conductive nitride, tungsten or other metal, or a combination of the foregoing. For example, the word lines W1 to Wn may use tantalum nitride (TaN) as material in the depicted embodiments.

In some embodiments, an optional liner layer 226 may be formed on a sidewall of the vertical channel 220 opposite to the gate dielectric layer 222. The liner layer 226 may include silicon oxide, silicon nitride, the like, or combinations thereof.

The gate dielectric layer 222 may be interposed between the vertical channel 220 and the string selection line SSL, between the vertical channel 220 and the word lines W1 to Wn, and between the vertical channel 220 and the ground selection line GSL. In some embodiments, the gate dielectric layer 222 is between the embedded portions 232 and the vertical channel 220. The string selection line SSL, the vertical channel 220 and the gate dielectric layer 222 adjacent to the string selection line SSL collectively form or define the string selection transistor SST as shown in FIG. 8. The word lines W1 to Wn, the vertical channel 220 and the gate dielectric layer 222 adjacent to the word lines W1 to Wn collectively form or define the memory cell M1 to Mn as shown in FIG. 8. The ground selection line GSL, the vertical channel 220 and the gate dielectric layer 222 adjacent to the ground selection line GSL collectively form or define the ground selection transistor GST as shown in FIG. 8. In some embodiments, the embedded portion 232 may include a convex surface 236 interfaced with the gate dielectric layer 222. Moreover, the vertical channel 220 may include a concave surface 238 interfaced with the gate dielectric layer 222. In greater detail, each embedded portion 232 and each vertical channel 220 may respectively include a convex surface 236 and a concave surface 238, and the gate dielectric layer 222 is between the convex surface 236 and the concave surface 238.

An isolation layer 228 may be formed to separate different regions of a word line (e.g., Wn), the string selection line SSL or the ground selection line GSL. A portion of the isolation layer 228 used to separate the word lines can be referred to as a deep trench isolation (DTI) layer. A top portion of the isolation layer 228 used to separate the string selection lines SSL can be referred to as a shallow trench isolation (STI) layer. A bottom portion of the isolation layer 228 used to separate the ground selection lines GSL can be referred to as a STI layer as well. In some embodiments, the isolation layer 228 may be formed over the substrate 202 and has opposite sides 240 and 242 that are asymmetrical. The vertical channels 220 are respectively embedded in the asymmetrical sides 240 and 242. In greater detail, the isolation layer 228 with asymmetrical sides 240 and 242 has a serpentine profile in top view, and the vertical channels 220 are respectively embedded in the asymmetrical sides 240 and 242 of the isolation layer 228. The isolation layer 228 may be formed by depositing a silicon oxide layer, silicon nitride layer or a silicon oxynitride layer, the like, or combinations thereof. For example, the isolation layer 228 may be formed by depositing tetraethoxysilane (TEOS). The formation methods of the isolation layer 228 include physical vapor deposition (PVD), chemical vapor deposition (CVD), and the like.

Another isolation layer 230 may be formed in parallel to the isolation layer 228. The isolation layer 230 has a different shape from the isolation layer 228. For example, the isolation layer 230 has a stripe shape in top view, and the isolation layer 228 has a serpentine shape in top view. A portion of the isolation layer 230 used to separate the word lines can be referred to as a deep trench isolation (DTI) layer. A top portion of the isolation layer 230 used to separate the string selection lines SSL can be referred to as a shallow trench isolation (STI) layer. A bottom portion of the isolation layer 230 used to separate the ground selection lines GSL can be referred to as a STI layer as well. The isolation layer 230 may be formed by depositing a silicon oxide layer, silicon nitride layer or a silicon oxynitride layer, and the like. For example, the isolation layer 230 may be formed by depositing TEOS. The formation methods of isolation layer 230 include physical vapor deposition (PVD), chemical vapor deposition (CVD), and the like.

Referring to FIG. 10, shown therein is a schematic perspective view of a portion of nonvolatile memory device 200. This embodiment is similar to the one shown in FIG. 9 except that string selection transistors SST are not shown in FIG. 10, so as to show a top view profile of the memory cells Mn. Other aspects of this embodiment are omitted for the purpose of simplicity.

Referring to FIG. 11, shown therein is a schematic perspective view of a portion of nonvolatile memory device 200. This embodiment is similar to the one shown in FIG. 9 except that the string selection transistors SST and memory cells M1-Mn are not shown in FIG. 11, so as show a top view profile of the ground selection transistors GST. Other aspects of this embodiment are omitted for the purpose of simplicity.

FIGS. 12A to 16A are schematic top views at various stages during the fabrication of memory device. FIGS. 12B to 16B are cross-section views taken along line B-B of FIGS. 12A to 16A respectively in accordance with some embodiments of the present disclosure. FIGS. 17A to 22A are horizontally cross-sectional views of the memory device taken along a level of one of removed silicon nitride layers in accordance with some embodiments of the present disclosure. FIGS. 17B to 22B are cross-sectional views taken along line B-B of FIGS. 17A to 22A in accordance with some embodiments of the present disclosure. FIGS. 14C, 16C, 17C, 18C, 20C, 21C, and 22C are cross-section views taken along line C-C of FIGS. 14A, 16A, 17A, 18A, 20A, 21A, and 22A in accordance with some embodiments of present disclosure. FIG. 19C is a partially enlarged view of FIG. 19B. FIGS. 14D, 16D, 17D, 18D, 19D, 20D, 21D, 22D are cross-sectional views taken along line D-D of FIGS. 14A, 16A, 17A, 18A, 19A 20A, 21A, 22A in accordance with some embodiments of present disclosure. FIG. 19E is cross-sectional views taken along line E-E of FIG. 19A in accordance with some embodiments of the present disclosure.

Figure 12A:
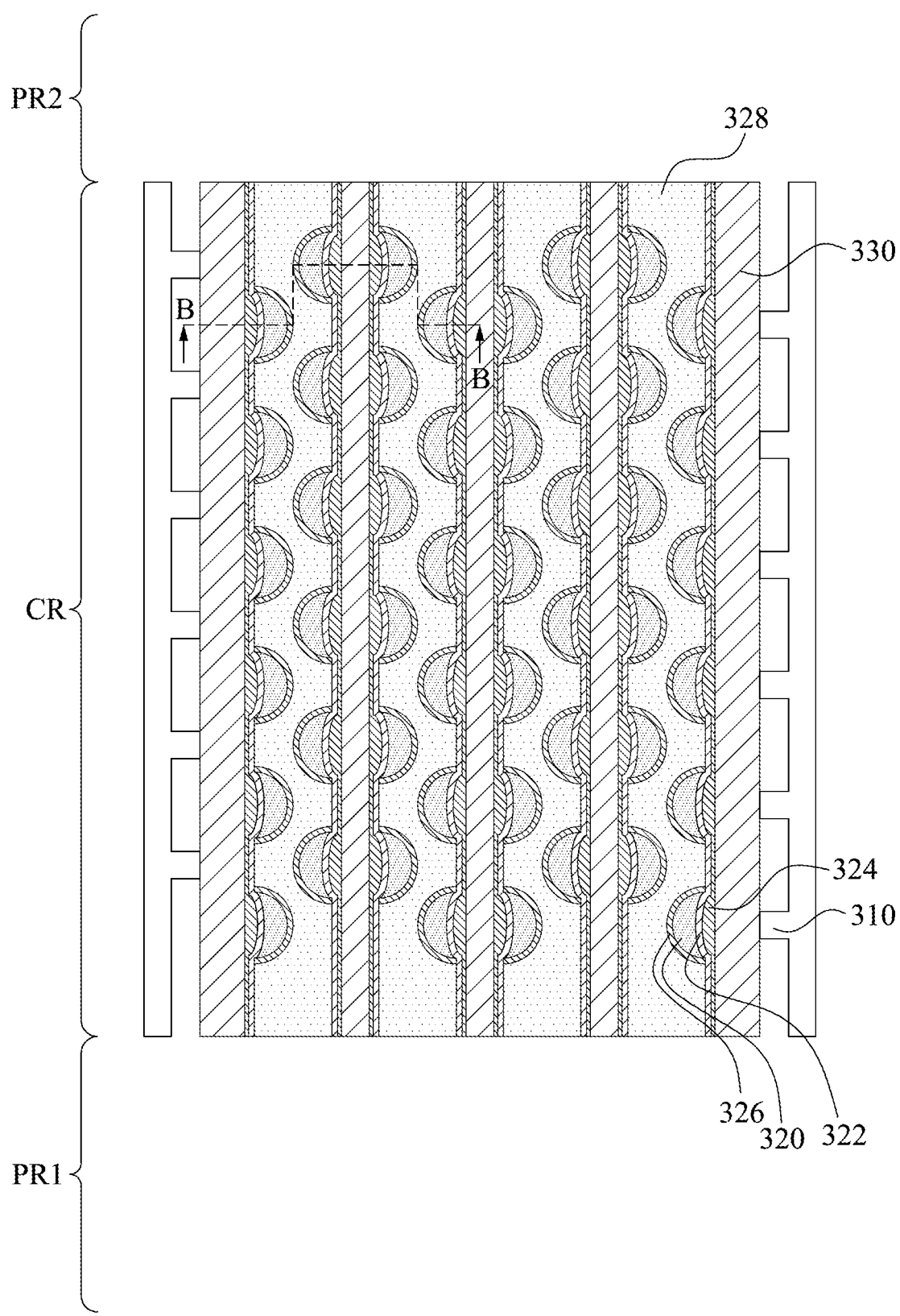
FIGS. 12A, 13A, 14A, 15A, and 16A are schematic top views of various stages in the fabrication of memory device in accordance with some embodiments of the present disclosure.
Figure 12B:
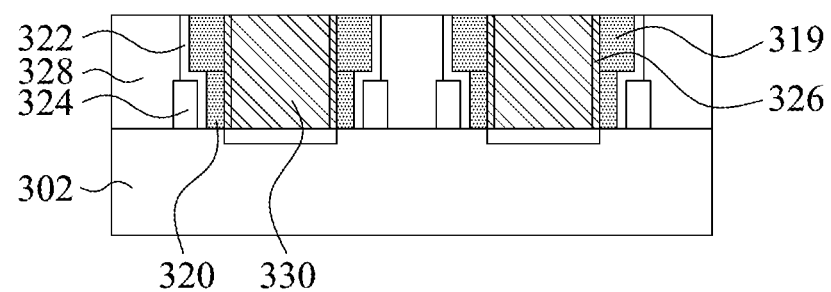
FIG. 12B is a cross-sectional view taken along line B-B of FIG. 12A in accordance with some embodiments of the present disclosure.

Referring to FIGS. 12A and 12B, these figures show an exemplary top view and a cross-section view of fabrication of ground selection transistor of memory device. It is understood that additional operations can be provided before, during, and after processes shown by FIGS. 12A and 12B, and some of the operations described below can be replaced or eliminated, for additional embodiments of the method. The order of the operations/processes may be interchangeable. The detail fabrication method of ground selection transistor and string selection transistor (as shown in FIG. 9) are omitted here and will be described with following embodiments.

A ground line 310 is formed on a substrate 302 using suitable lithography, etching and/or deposition techniques. A first polysilicon layer 319 and silicon nitride layer (not shown) are formed on a substrate 302. The substrate 302 is a silicon substrate in the present embodiment. Alternatively, the substrate 302 may include another elementary semiconductor, such as germanium; a compound semiconductor including silicon carbide, gallium arsenic, gallium phosphide, indium phosphide, indium arsenide, and/or indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 302 is a SOI such as having a buried layer.

After the first polysilicon layer 319 and the silicon nitride later are formed, shallow trench isolation (STI) etching process is performed. The first liner layer 326 may be formed on the sidewall of the first polysilicon layer 319 and silicon nitride layer. The first liner layer 326 may include typical interconnect barrier liner layer materials, such as tantalum, tantalum nitride, and combinations thereof or titanium, titanium nitride and combinations thereof. In some embodiments, a CMP process is performed to remove excess materials.

In some embodiments, another STI etching process is performed and the silicon nitride layer is removed. After the silicon nitride layer is removed, a second polysilicon layer 320 with impurity dopant is filled. In some embodiments, different regions of second polysilicon layer 320 can be doped with suitable dopants to serve as source/drain regions and channel regions of ground selection transistors.

A first gate dielectric layer 322 may be formed as embedded in the second polysilicon layer 320. In some embodiments, the first gate dielectric layer 322 may be silicon oxide or silicon nitride, and in other embodiments, the first gate dielectric layer 322 may include high-k dielectric materials. For example, the first gate dielectric layer 322 may include one layer of metal oxide or a silicate of Hf, Al, Zr, combinations thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_5$, $Y_2O_3$, $HfO_2$, $ZrO_2$, HfSiON, $YGe_xO_y$, $YSi_xO_y$, and $LaAlO_3$, and the like.

A ground selection line 324 may be formed as embedded in the first gate dielectric layer 322. The ground selection line 324 may be a doped polysilicon, or other conductive material such as tantalum nitride or other conductive nitride, tungsten or other metal, or a combination of the foregoing. For example, the ground selection line 324 may use TaN, silicide or self-aligned silicide (salicide) in the embodiment.

After STI etching process is performed again, a shallow trench isolation (STI) layer 328 may be formed to separate each of the first polysilicon layer 319 and the second polysilicon layer 320 to define the ground selection line 324 as the conductive layer. The STI layer 328 may be formed by depositing a silicon oxide layer, silicon nitride layer or a silicon oxynitride layer, and the like. For example, the STI layer 328 may be TEOS. The STI layer 328 has a serpentine shape in top view and thus has asymmetrical opposite sides, and portions of the second polysilicon layers 320 are respectively embedded in the asymmetrical sides. Moreover, another STI layer 330 may be formed in parallel to the STI layer 328. The STI layer 330 may be formed by depositing a silicon oxide layer, silicon nitride layer or a silicon oxynitride layer, and the like. For example, the STI layer 330 may be TEOS.

Referring to FIG. 12A, the first polysilicon layer 319, the second polysilicon layer 320, the first gate dielectric layer 322, and the ground selection line 324 are formed in a cell region CR to serve as ground selection transistors. In such a way, embedded portions of the ground selection line 324 opposite and embedded in the first polysilicon layer 319 and the second polysilicon layer 320 can serve as gates of the ground selection transistors. Peripheral regions PR1 and PR2 are on opposite sides of the cell region CR, and free of the ground selection transistors. Fabrication of the ground selection transistors is similar to fabrication of the memory cells as described with reference with FIGS. 13A-23 below.

Figure 13A:
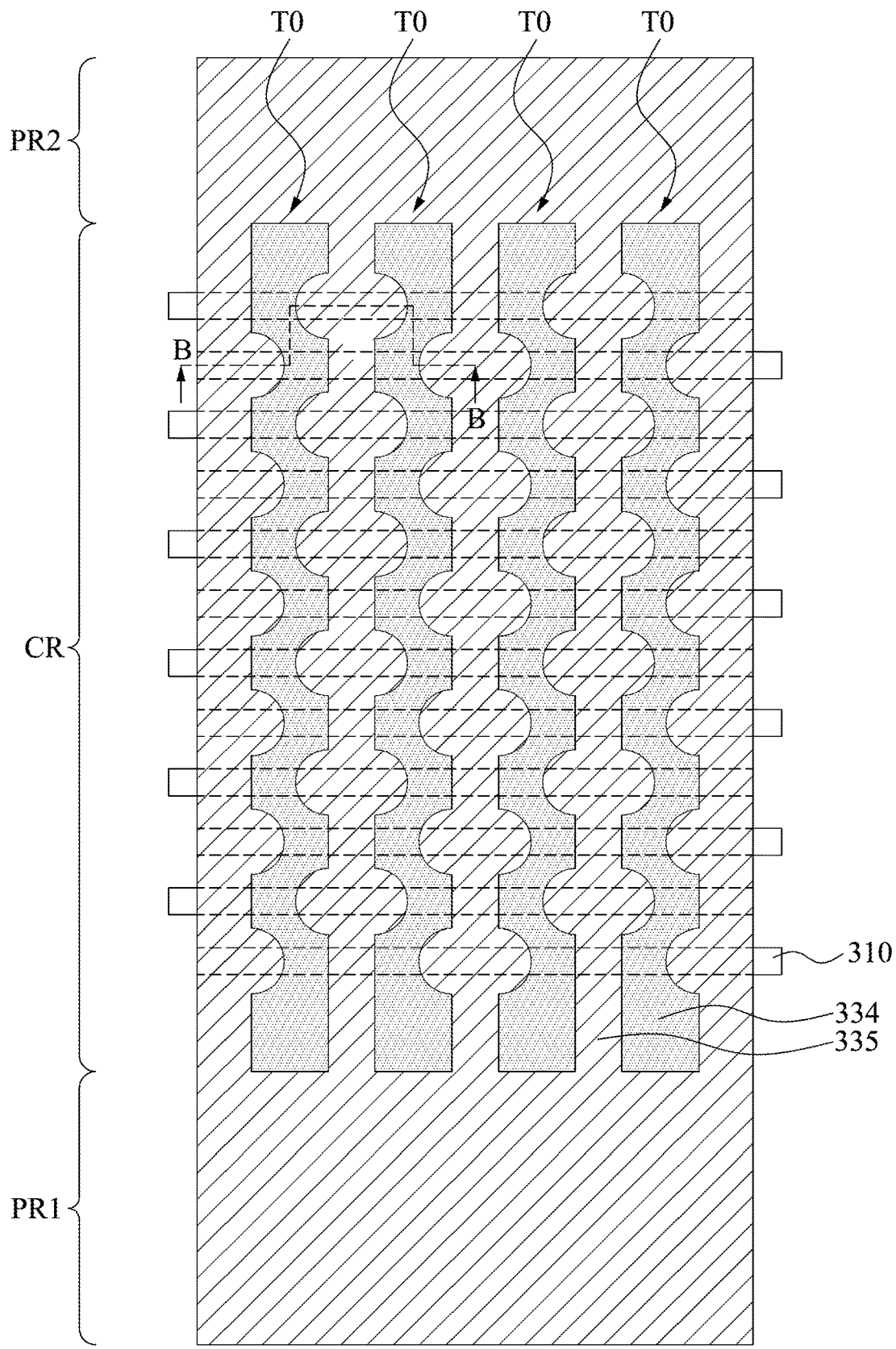
Figure 13B:
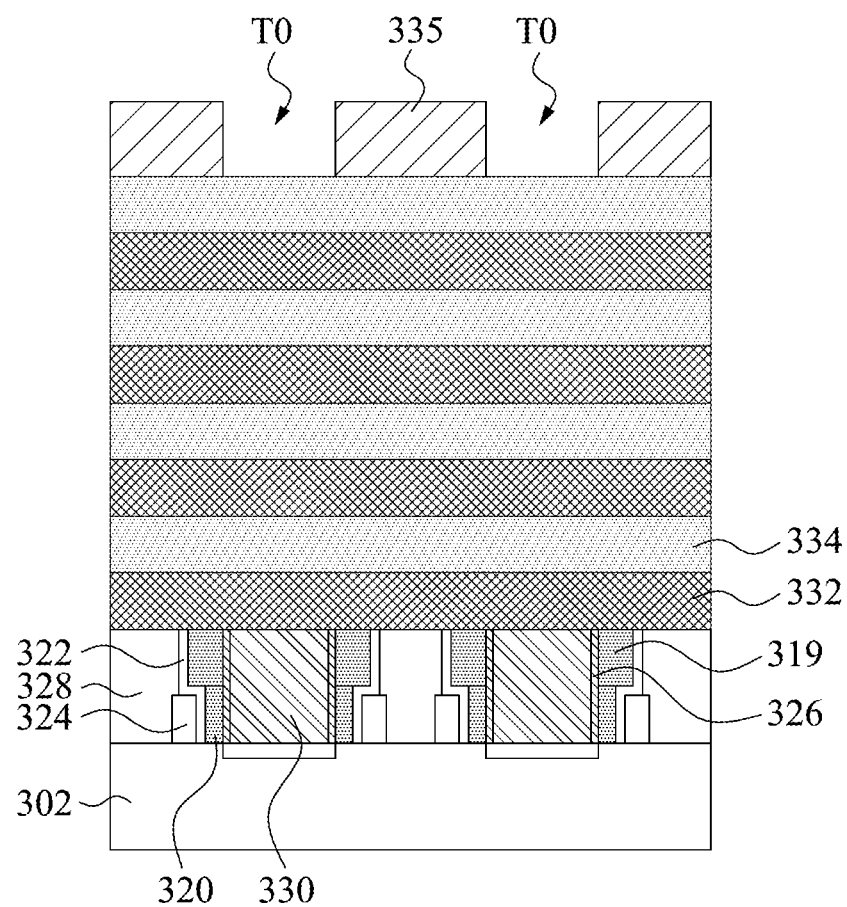
FIG. 13B is a cross-sectional view taken along line B-B of FIG. 13A in accordance with some embodiments of the present disclosure.

Referring to FIGS. 13A and 13B, a plurality of silicon nitride layers 332 and third polysilicon layers 334 are alternatingly stacked on the ground selection transistors and across the cell region CR and the peripheral regions PR1 and PR2. A patterned hard mask layer 335 is formed over the stack of third polysilicon layers 334 and silicon nitride layers 332. The patterned hard mask layer 335 may include photoresist, silicon dioxide, silicon carbon nitride, silicon oxynitride, silicon nitride, or the like, but other suitable dielectric films may be used. For example, silicon nitride may be used in the embodiment. The patterned hard mask layer 335 may be formed using suitable deposition, lithography, and/or etching techniques. Patterning the hard mask layer 335 results in serpentine trenches T0 in the patterned hard mask layer 335 arranged in parallel. The serpentine trenches T0 expose underlying materials (e.g., the third polysilicon layer 334) in the cell region CR. Peripheral regions PR1 and PR2 are covered by the hard mask layer 335 so as to protect the stack of third polysilicon layers 334 and silicon nitride layers 332 in the peripheral regions PR1 and PR2.

Figure 14A:
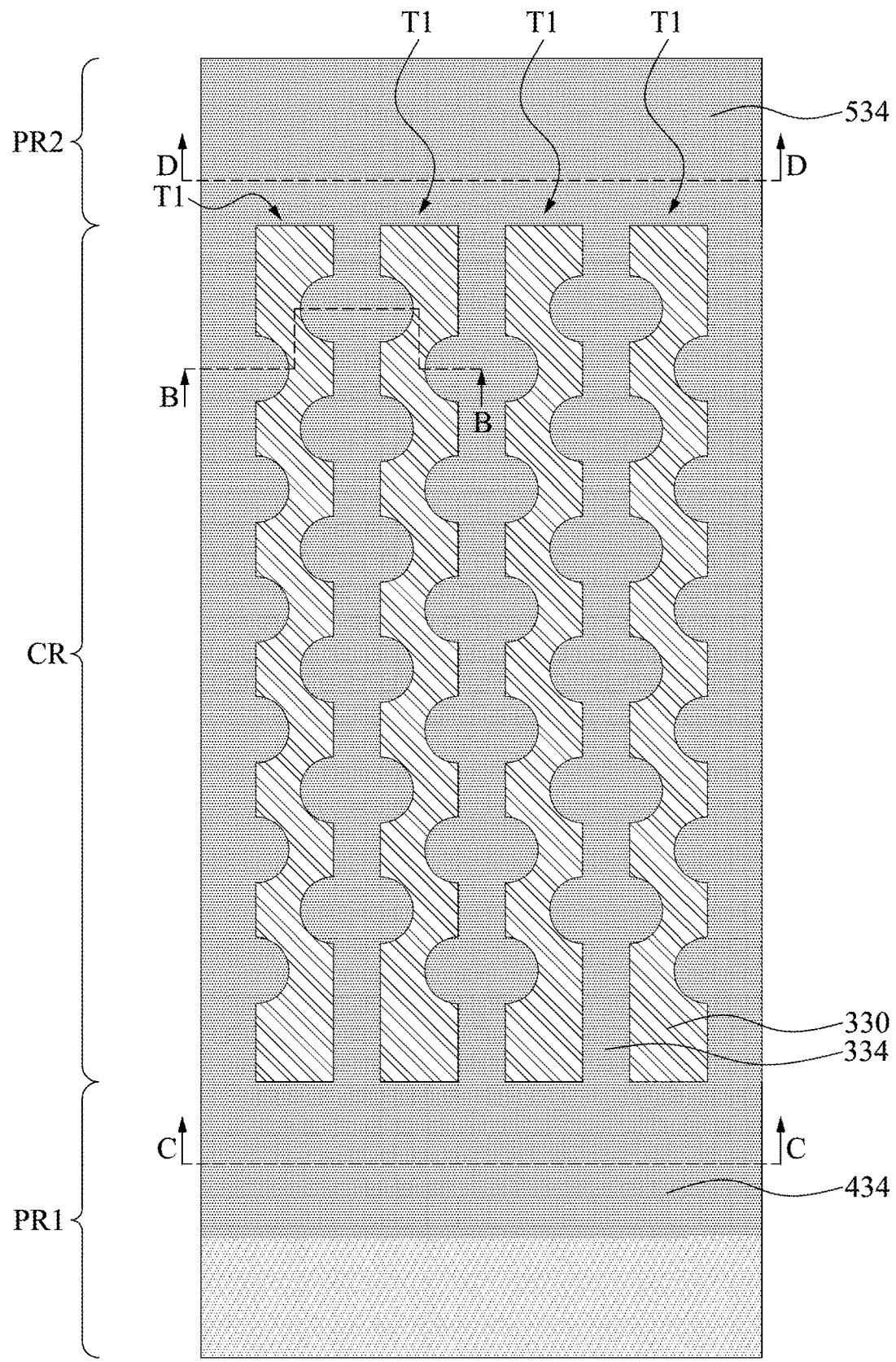
Figure 14B:
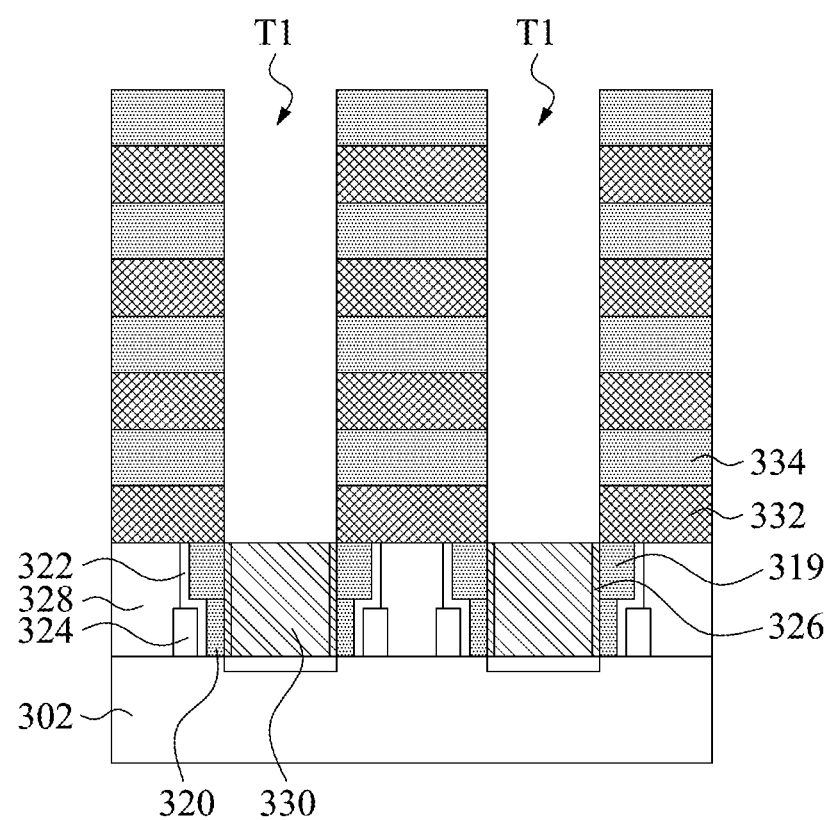
FIG. 14B is a cross-sectional view taken along line B-B of FIG. 14A in accordance with some embodiments of the present disclosure.
Figure 14C:
FIG. 14C is a cross-sectional view taken along line C-C of FIG. 14A in accordance with some embodiments of the present disclosure.
Figure 14D:
FIG. 14D is a cross-sectional view taken along line D-D of FIG. 14A in accordance with some embodiments of the present disclosure.

Referring to FIGS. 14A and 14B, the DTI etching is performed to the exposed materials uncovered by the patterned hard mask layer 335 using the patterned hard mask layer 335 as an etch mask, so that the pattern of serpentine trenches T0 are transferred to the stack of the silicon nitride layers 332 and the third polysilicon layers 334, resulting in etching trenches T1 into the stack of the silicon nitride layers 332 and the third polysilicon layers 334. The DTI etching terminates at the STI layer 330. In some embodiments, an end point detection technique may be used in determining stopping of the DTI etching process. The etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like. The hard mask layer 335 is removed from the cell region CR, and the peripheral regions PR1 and PR2. Referring to FIGS. 14C and 14D, a plurality of silicon nitride layers 432 and third polysilicon layers 434 are alternatingly stacked on the peripheral region PR1. The silicon nitride layers 432 continuously extend from the corresponding silicon nitride layers 332 in the cell region CR, and the third polysilicon layers 434 continuously extend from the corresponding third polysilicon layers 334 in the cell region CR as well. A plurality of the silicon nitride layers 532 and the third polysilicon layer 534 are alternatingly stacked on the peripheral region PR2 as well. The silicon nitride layers 532 continuously extend from the corresponding silicon nitride layers 332 in the cell region CR, and the third polysilicon layers 534 continuously extend from the corresponding third polysilicon layers 334 in the cell region CR as well.

Figure 15A:
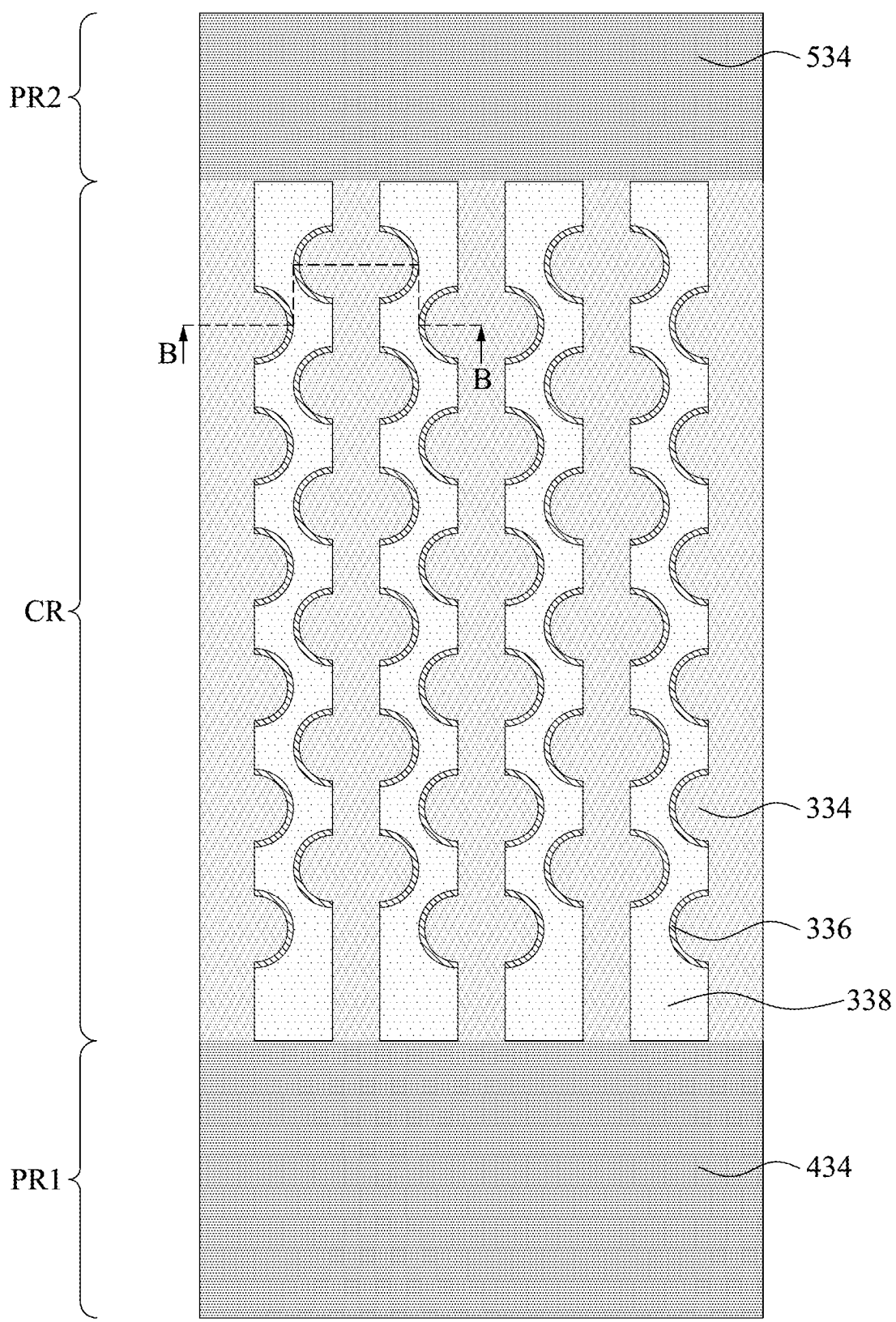
Figure 15B:
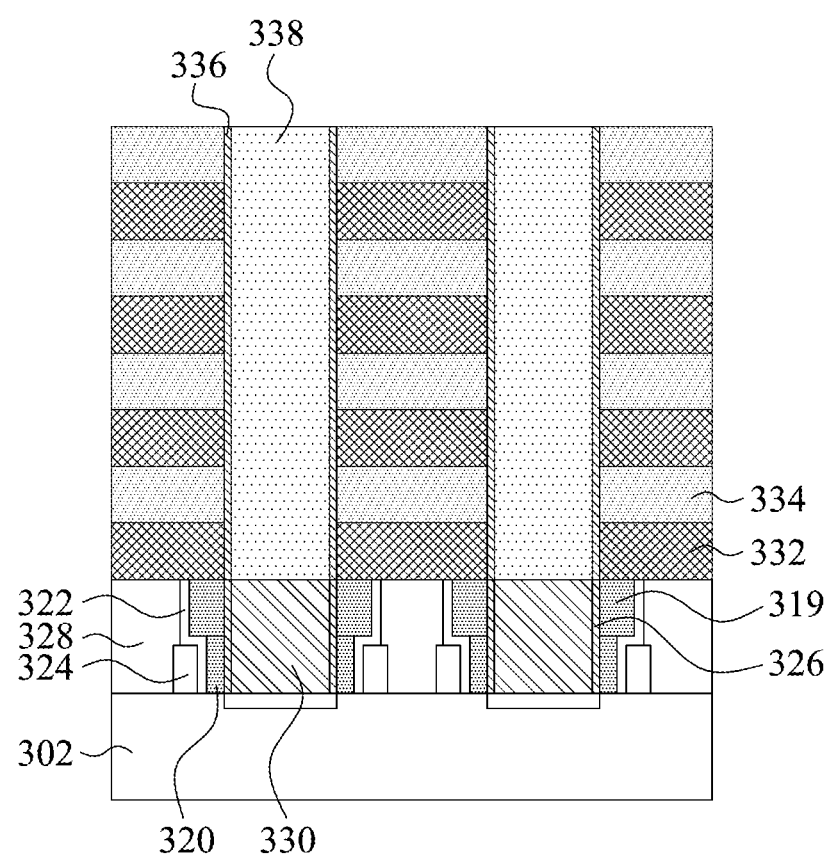
FIG. 15B is a cross-sectional view taken along line B-B of FIG. 15A in accordance with some embodiment of the present disclosure.

Referring to FIGS. 15A and 15B, the second liner layers 336 is formed on the exposed sidewall of the stack of the silicon nitride layer 332 and the third polysilicon layers 334. After sidewalls of the trenches T1 are lined by the second liner layers 336, the trenches T1 are then filled with insulating materials to form first DTI layers 338 in the respective trenches T1. In some embodiments, the first DTI layers 338 include silicon oxide layer, silicon nitride layer or silicon oxynitride layer, and the like. The first DTI layers 338 may be formed by CVD, PECVD, ALD, or FCVD. A planarization process, such as a CMP process, may be performed to remove excess materials of second liner layers 336 and/or first DTI layers 338.

Figure 16A:
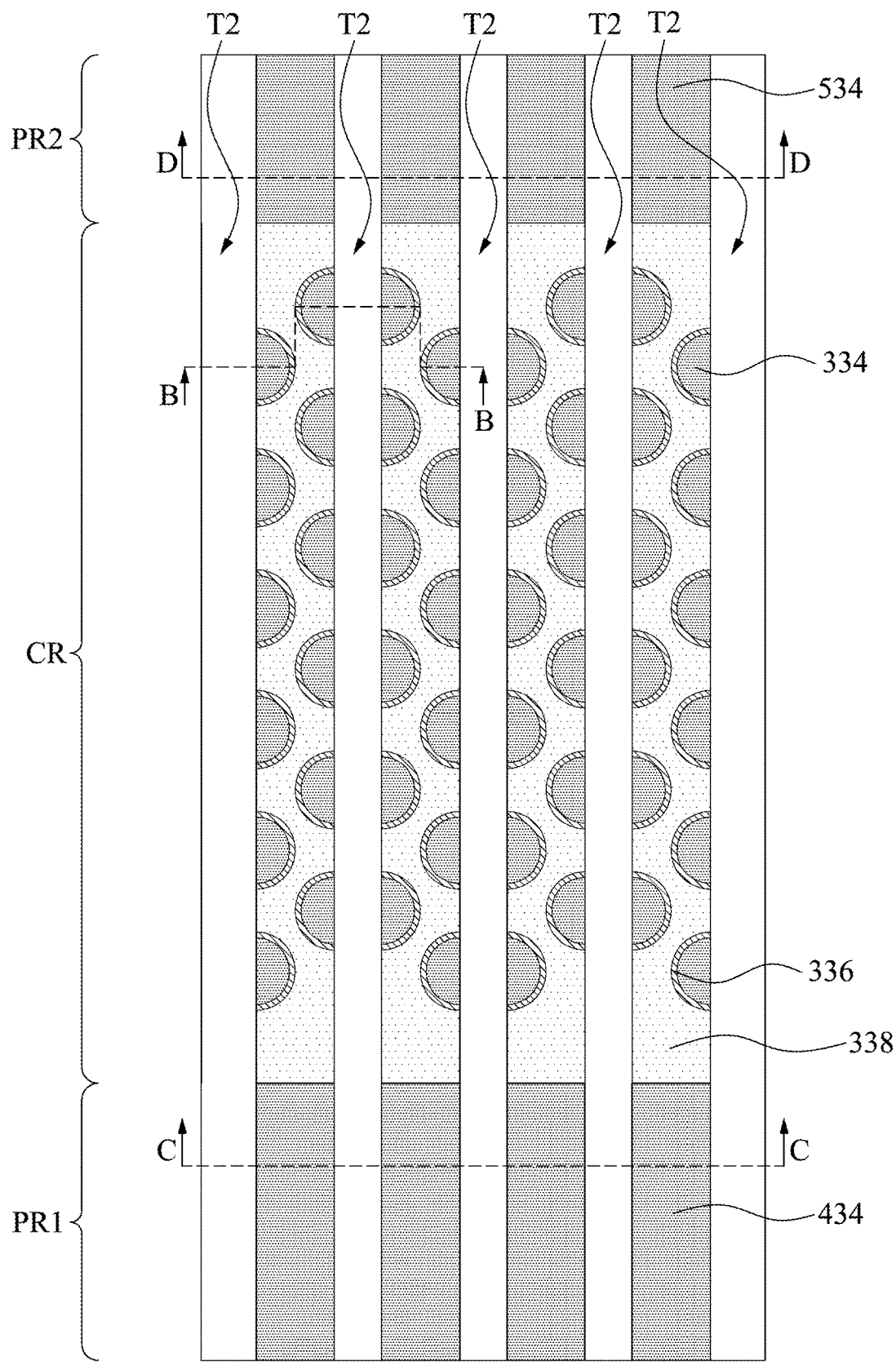
Figure 16B:
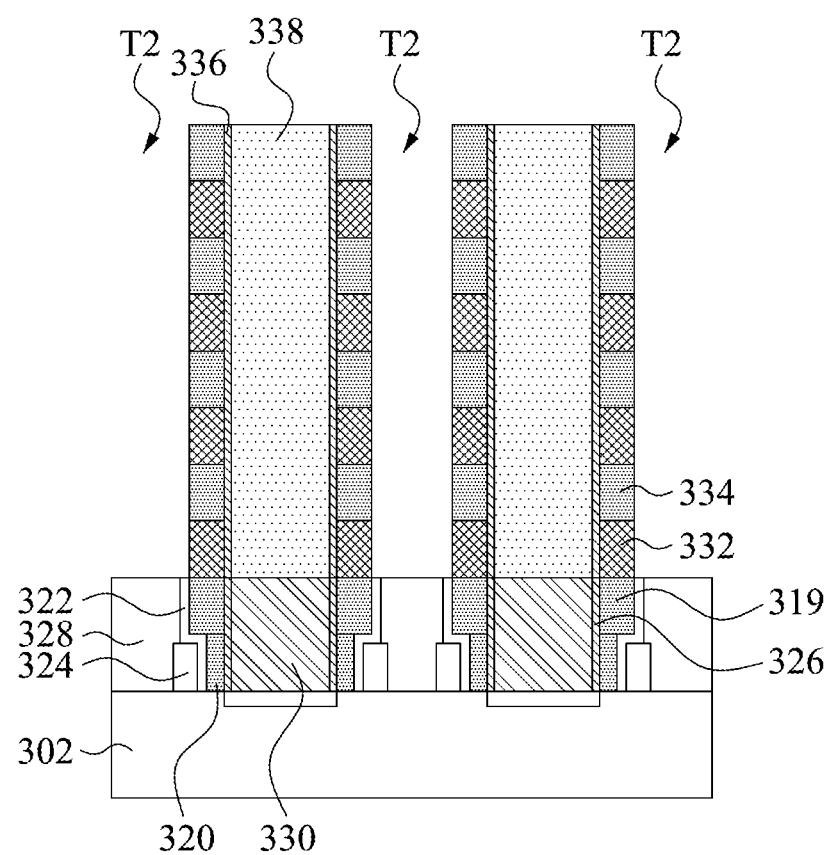
FIG. 16B is a cross-sectional view taken along line B-B of FIG. 16A in accordance with some embodiments of the present disclosure.
Figure 16C:
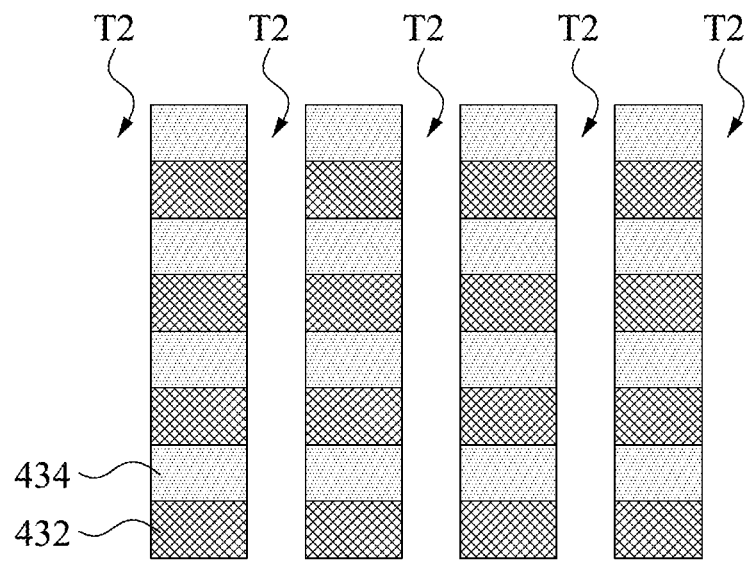
FIG. 16C is a cross-sectional view taken along line C-C of FIG. 16A in accordance with some embodiments of the present disclosure.
Figure 16D:
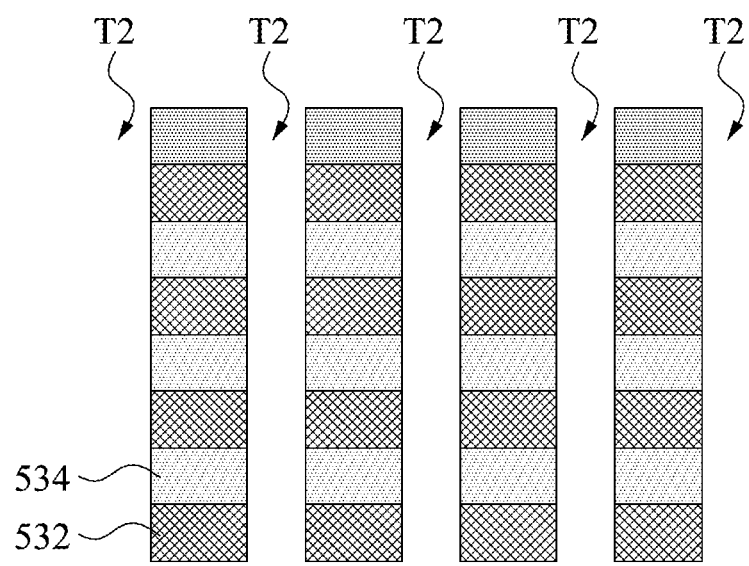
FIG. 16D is a cross-sectional view taken along line D-D of FIG. 16A in accordance with some embodiments of the present disclosure.

Referring to FIGS. 16A to 16D, another DTI etching process is performed to etch trenches T2 into the stack of silicon nitride layers 332 and third polysilicon layers 334 so as to form active area. The trenches T2 are alternatingly arranged with the first DTI layers 338. The trenches T2 have a stripe shape, different from the serpentine shape of the first DTI layers 338. The trenches T2 extends across the cell region CR and the peripheral regions PR1 and PR2, so that the trenches T2 are also etched into the stack of silicon nitride layers 432 and third polysilicon layers 434 in the peripheral region PR1 (as shown in FIG. 16C), and the trenches T2 are also etched into the stack of silicon nitride layers 532 and third polysilicon layers 534 in the peripheral region PR2 (as shown in FIG. 16D). An end point detection technique may be used in determine stopping of the DTI etching process. The etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2.H_2O$ (APM), $NH_2OH$, KOH, $HNO_3:NH_4F:H_2O$, and/or the like.

Figure 17A:
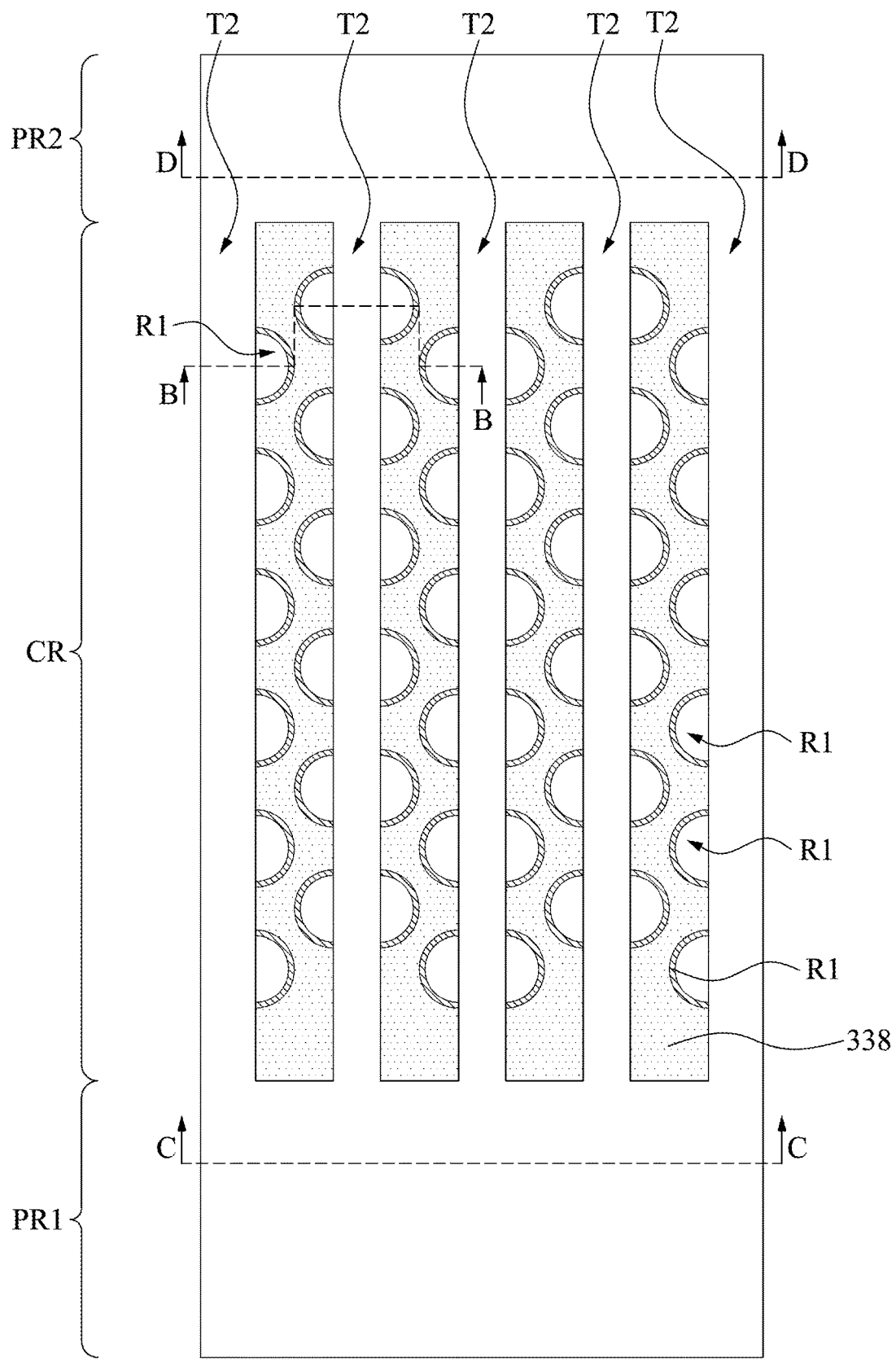
FIGS. 17A, 18A, 19A, 20A, 21A, 22A, and 23 are horizontally cross-sectional views of the memory device taken along a level of one of removed silicon nitride layers in accordance with some embodiments of the present disclosure.
Figure 17B:
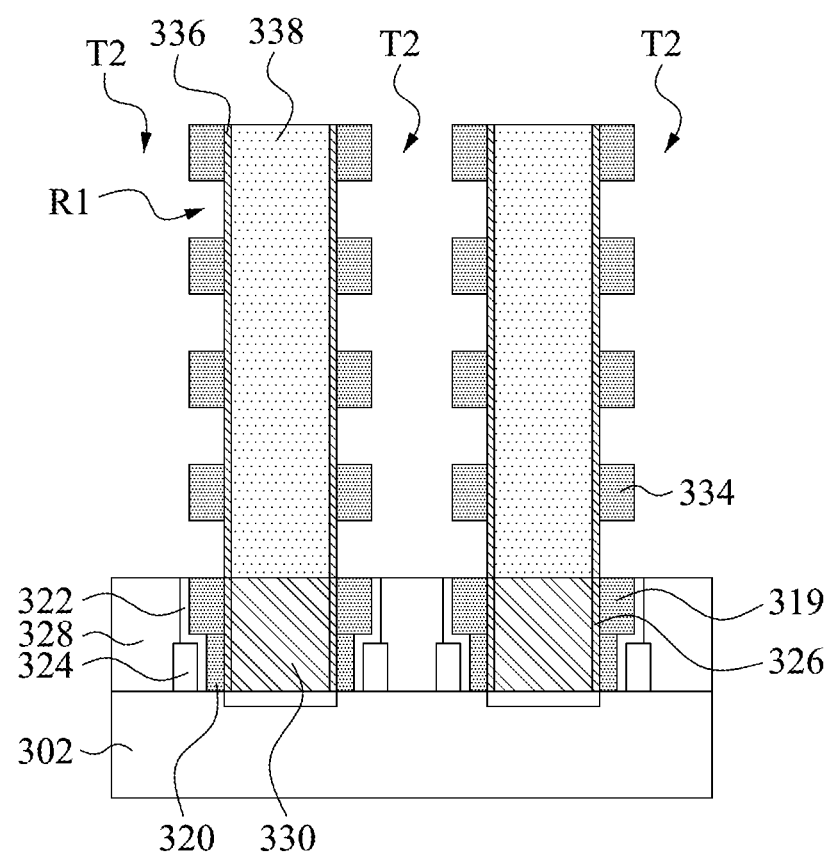
FIG. 17B is a cross-section view taken along line B-B of FIG. 17A in accordance with some embodiments of the present disclosure.
Figure 17C:
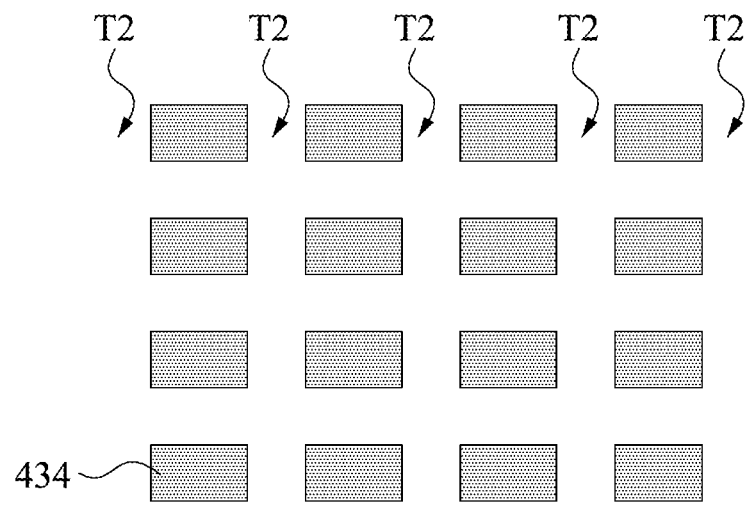
FIG. 17C is a cross-sectional view taken along line C-C of FIG. 17A in accordance with some embodiments of the present disclosure.
Figure 17D:
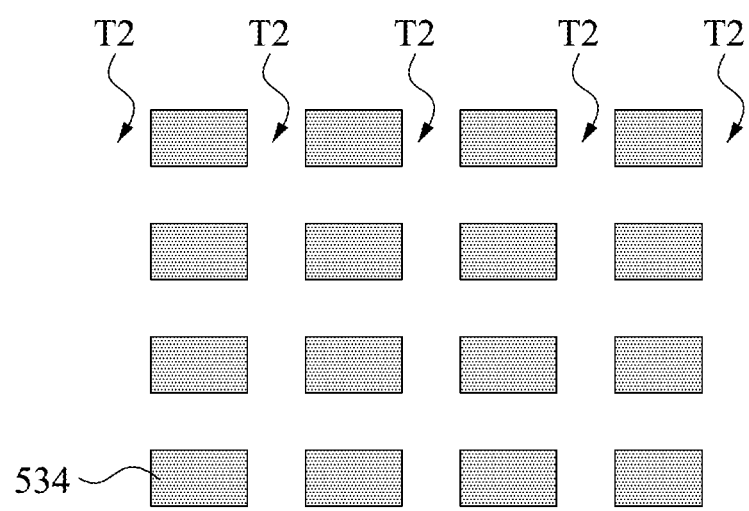
FIG. 17D is a cross-sectional view taken along line D-D of FIG. 17A in accordance with some embodiments of the present disclosure.

Referring to FIGS. 17A and 17B, the silicon nitride layers 332 are removed. After the silicon nitride layers 332 are removed, recesses R1 are formed between the vertically arranged third polysilicon layers 334 in the cell region CR. It is understood that FIG. 17A and following FIGS. 18A, 19A, 20A, 21A, 22A and 23 are horizontally cross-sectional views of the memory device taken along a level of one of removed silicon nitride layers. Moreover, as shown in FIGS. 17C and 17D, the silicon nitride layers 432 and 532 are removed from the polysilicon/nitride stacks in the peripheral regions PR1 and PR2 as well, which in turn results in the third polysilicon layers 434 without intervening silicon nitride layers in the peripheral region PR1, and the third polysilicon layers 534 without intervening silicon nitride layers in the peripheral region PR2.

Figure 18A:
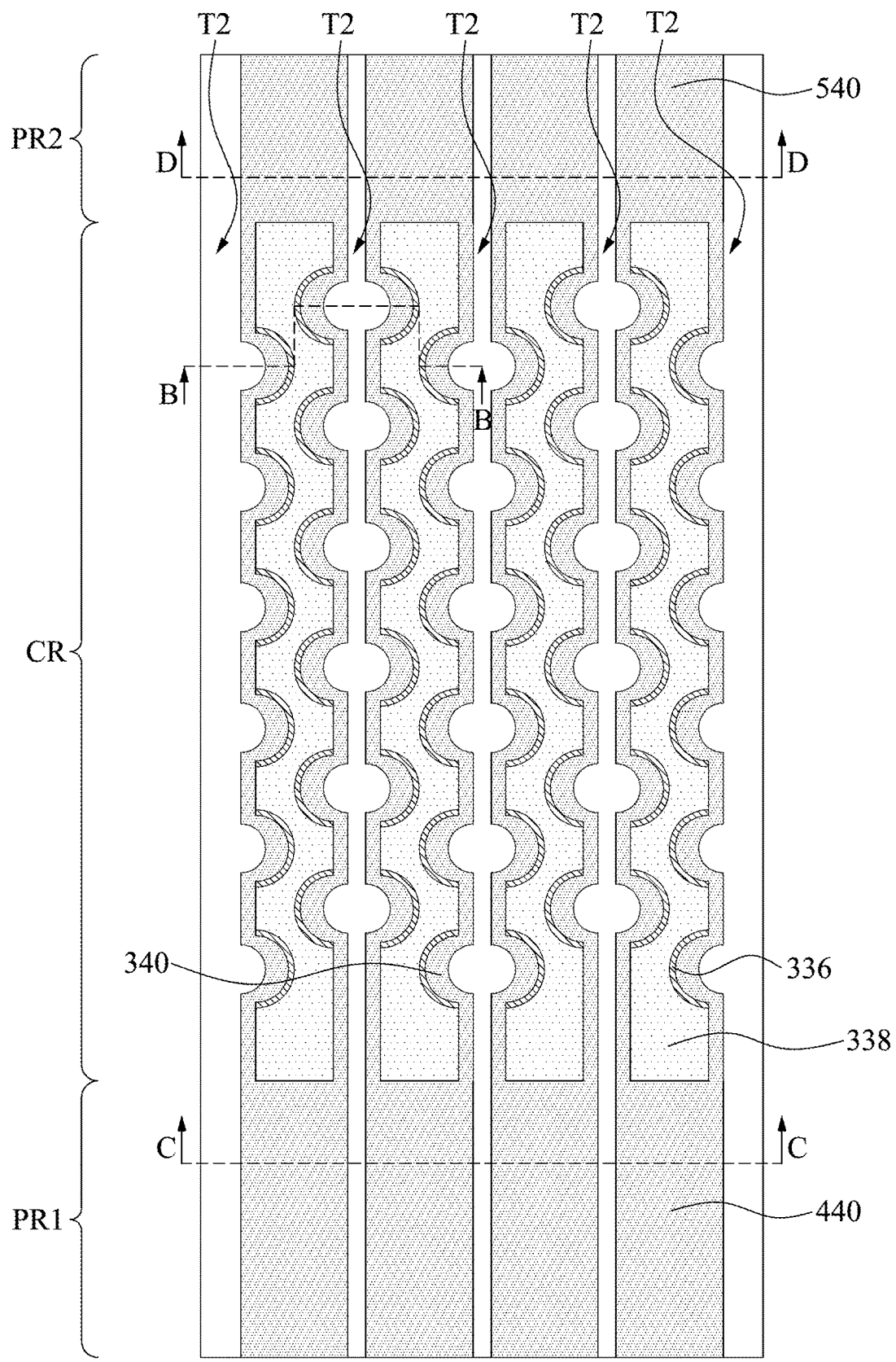
Figure 18B:
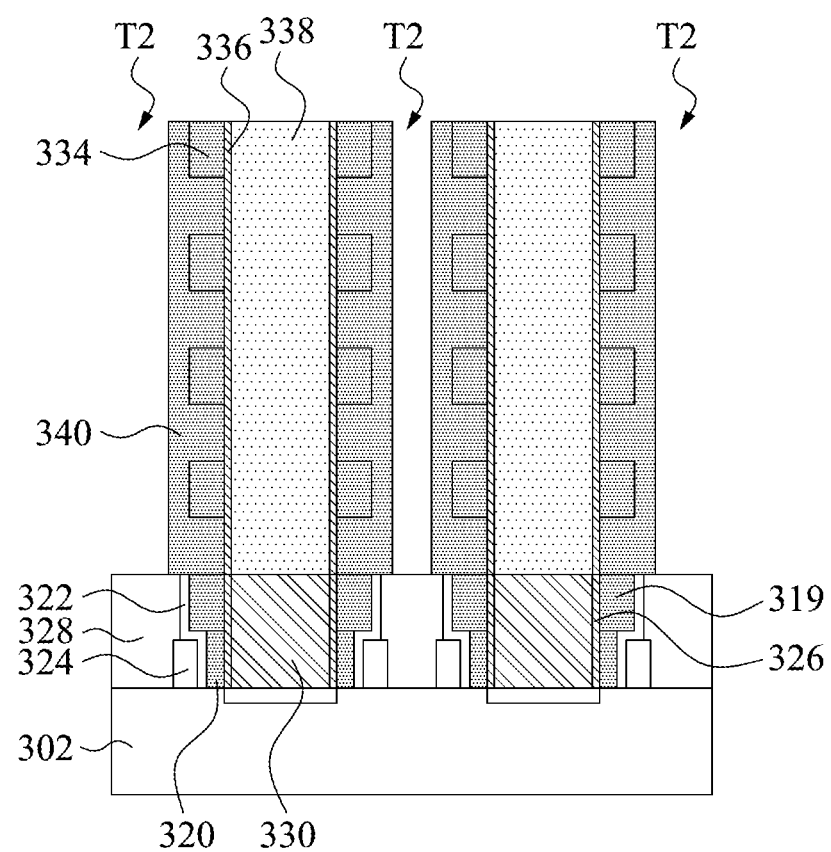
FIG. 18B is a cross-sectional view taken along line B-B of FIG. 18A in accordance with some embodiments of the present disclosure.
Figure 18C:
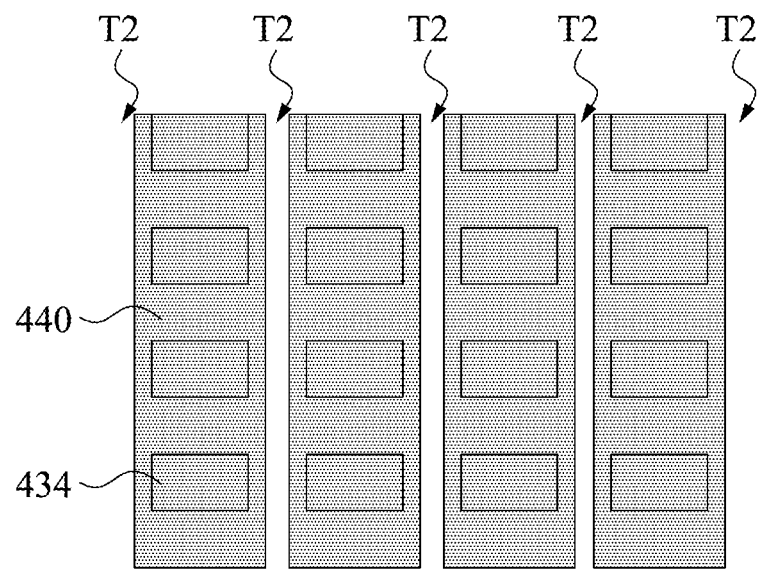
FIG. 18C is a cross-sectional view taken along line C-C of FIG. 18A in accordance with some embodiments of the present disclosure.
Figure 18D:
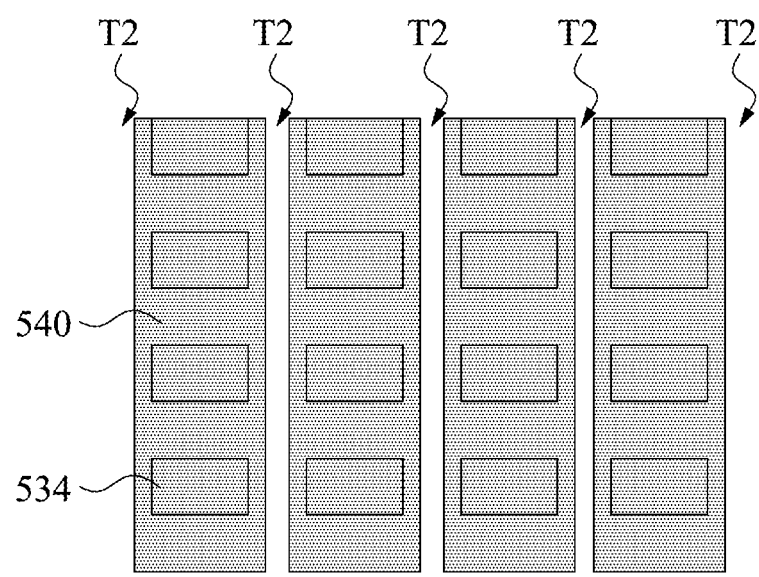
FIG. 18D is a cross-sectional view taken along line D-D of FIG. 18A in accordance with some embodiments of the present disclosure.

Referring to FIGS. 18A and 18B, recessed cell integration (RCI) process is performed. That is, after the recesses R1 are formed, the recesses R1 are filled with a fourth polysilicon layer 340 with impurity dopant. After the fourth polysilicon layer 340 is formed, a thermal annealing process is performed. As shown in FIGS. 18C and 18D, the fourth polysilicon layers 440 and 540 are formed on the peripheral regions PR1 and PR2, respectively.

Referring to FIGS. 19A-19E, implant processes are performed to the fourth polysilicon layer 340, followed by an anneal process to active the implanted dopants. The fourth polysilicon layer 340 has a semi-elliptical profile in top view. The fourth polysilicon layer 340 faces toward the second trench T2. The third polysilicon layer 334 and the fourth polysilicon layer 340 are defined as vertical channel 350. Each of the fourth polysilicon layers 340 is alternatingly stacked on the third polysilicon layer 334. That is, the vertical channel 350 has an undulating sidewall 351. In some embodiments, the undulating sidewall 351 of the vertical channel 350 includes a plurality of peaks 351p and troughs 351t alternating arranged.

Figure 19A:
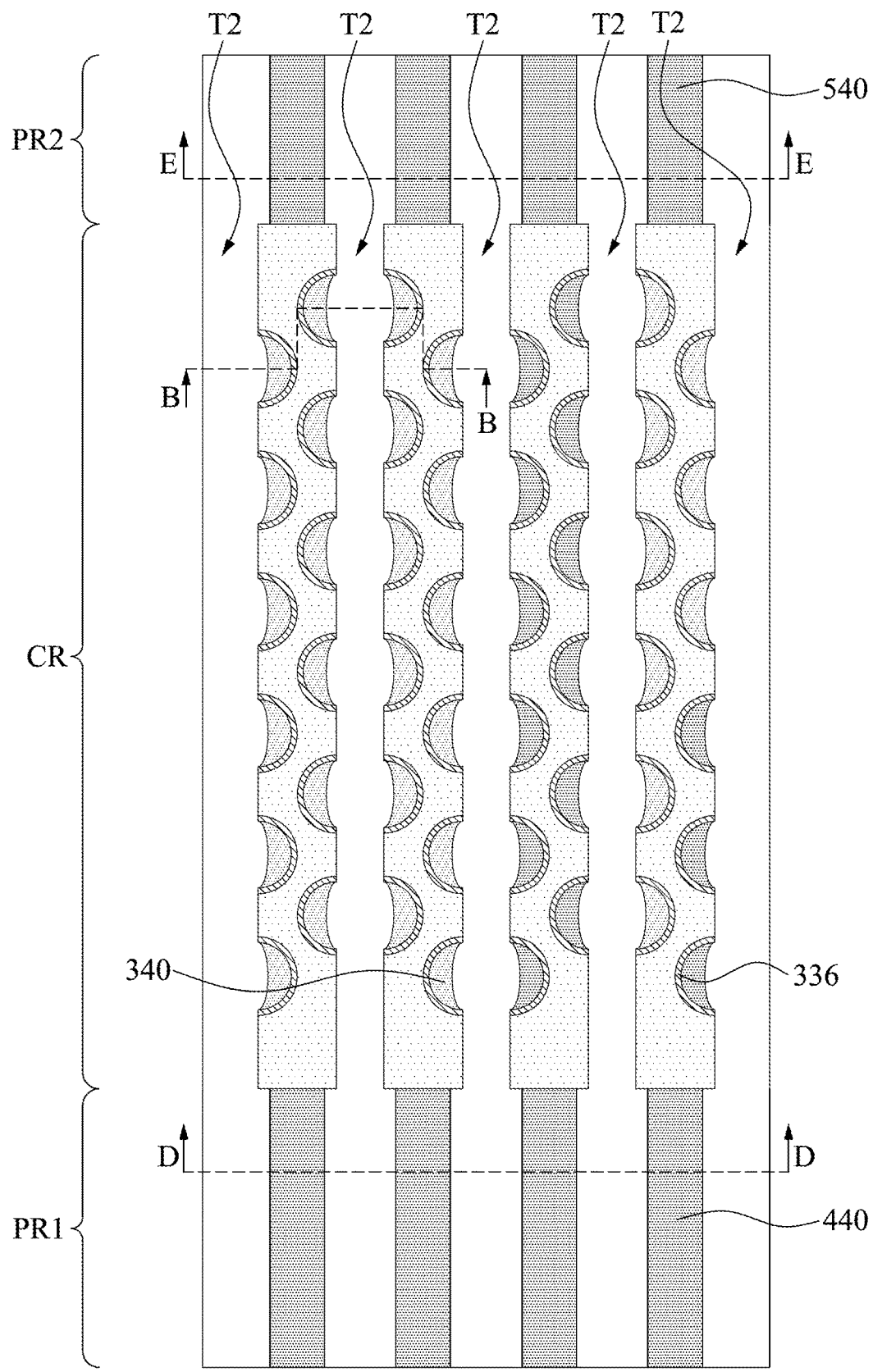
Figure 19B:
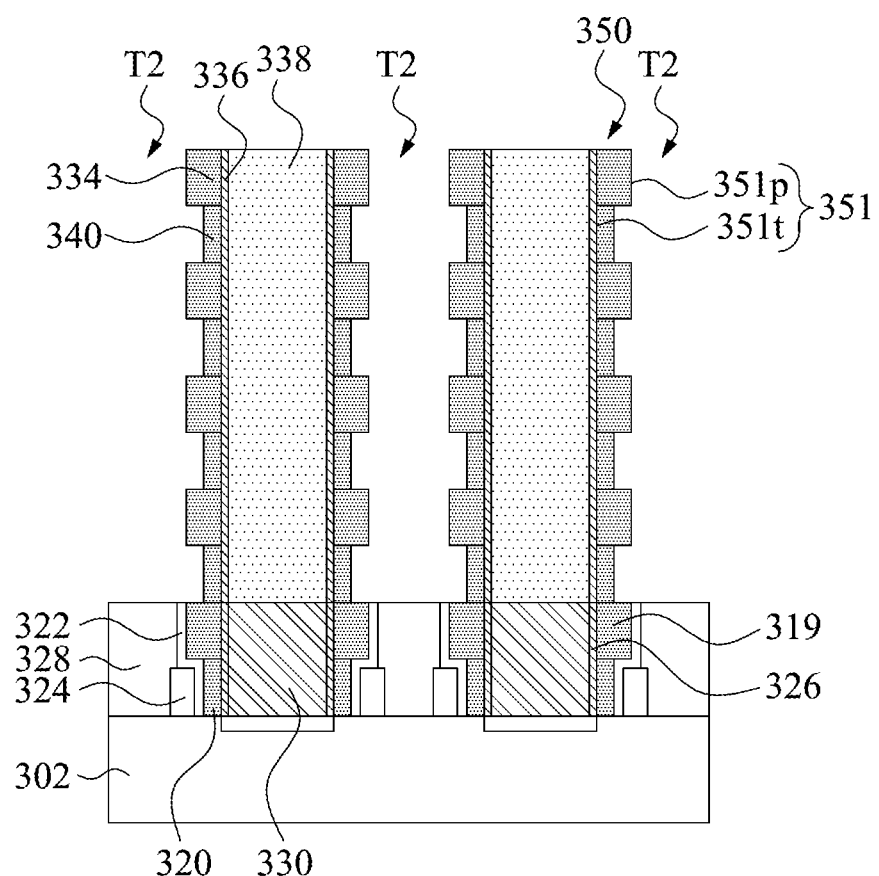
FIG. 19B is a cross-sectional view taken along line B-B of FIG. 19A in accordance with some embodiments of the present disclosure.
Figure 19C:
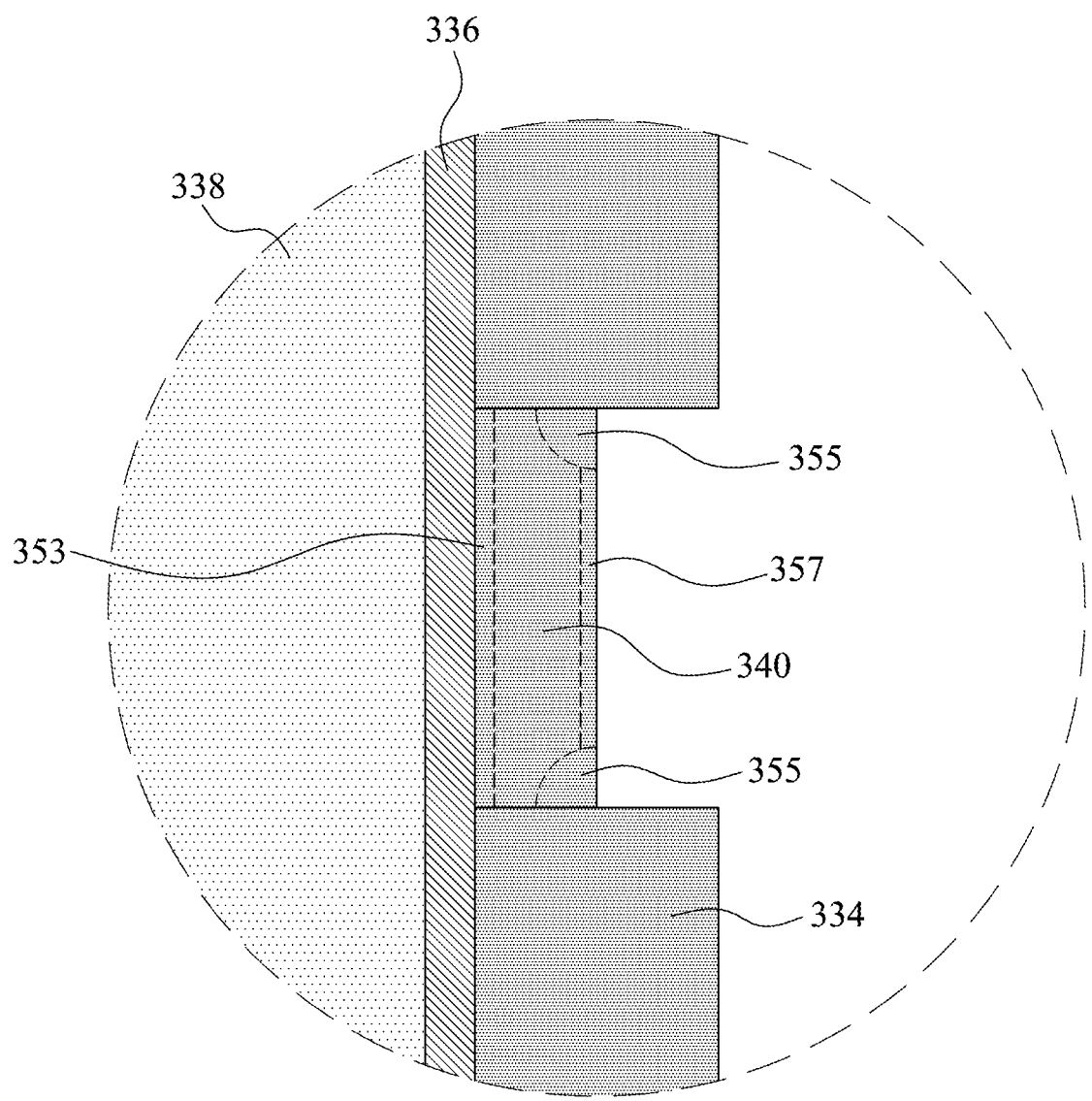
FIG. 19C is a partially enlarged view of FIG. 19B.
Figure 19D:
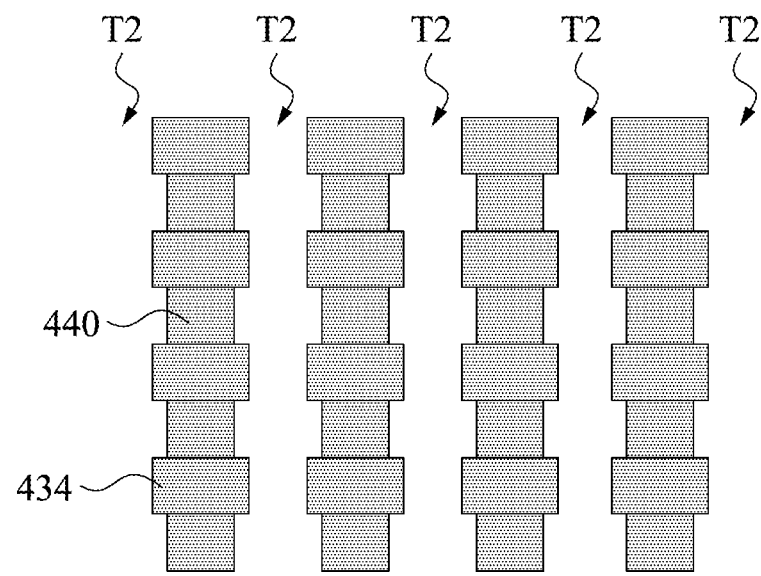
FIG. 19D is a cross-sectional view taken along line D-D of FIG. 19A in accordance with some embodiments of the present disclosure.
Figure 19E:
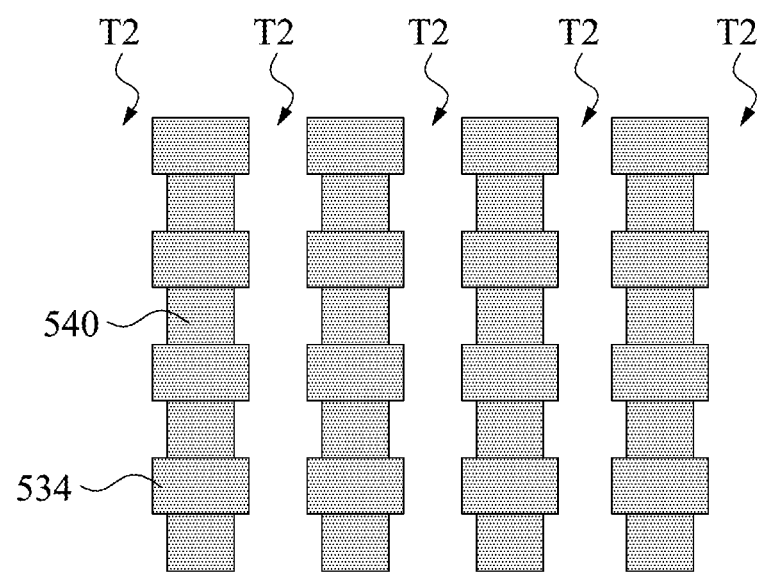
FIG. 19E is a cross-sectional view taken along line E-E of FIG. 19A in accordance with some embodiments of the present disclosure.

FIG. 19C is partially enlarged view of FIG. 19B. Referring to FIG. 19C, source/drain regions 355 are formed in the fourth polysilicon layers 340 by controlling dopants of ion implantation with a specific angle. The implant processes results in a substrate implant region 353, source/drain regions 355, and a channel region 357 in each fourth polysilicon layer 340. The channel region 357 is present between the source/drain regions 355. The dopant type of ion implantation may include P-type dopants or N-type dopants. For example, P-type dopants may be boron or $BF_2$, and N-type dopants may be phosphorous or arsenic. In some embodiment, a P-type dopant is implanted in the substrate implant region 353, an N-type dopant is in the source/drain regions 355, and a P-type dopant or N-type dopant is implanted in the channel region 357. In other words, the substrate implant region 353, the source/drain regions 355, and the channel region 357 can be doped with suitable dopants according to their electrical properties. As a result of the implantation processes, the source/drain regions 355 and the channel region 357 between the source/drain regions 355 can serve as a transistor that acts as a memory cell.

In some embodiments, the anneal process performed after the implant processes is a rapid thermal annealing (RTA) process performed at a temperature ranging between about 700 Celsius and about 1200 Celsius for a duration ranging between about 30 seconds and about 90 seconds. In further embodiments, conventional furnace annealing (CFA) process may be performed at a temperature ranging between about 900 Celsius and about 1200 Celsius for a duration ranging between about 30 minutes and about 2 hours.

Referring to FIGS. 20A to 20D, a second gate dielectric layer 342 is formed on the sidewall of the fourth polysilicon layer 340. The second gate dielectric layer 342 is conformal to the undulating sidewall 351 of the vertical channel 350. In some embodiments, the second gate dielectric layer 342 is made of silicon oxide or silicon nitride, and in other embodiments, the second gate dielectric layer 342 may include high-k dielectric materials. For example, the second gate dielectric layer 342 may include one or more layers of metal oxide or a silicate of Hf, Al, Zr, combinations thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_5$, $Y_2O_3$, $HfO_2$, $ZrO_2$, HfSiON, $YGe_xO_y$, $YSi_xO_y$, and $LaAlO_3$, and the like.

After the second gate dielectric layer 342 is formed, a conductive layer 344 is formed as embedded in the second gate dielectric layer 342 using suitable deposition techniques. The conductive layer 344 is doped polysilicon, or other conductive material such as tantalum nitride or other conductive nitride, tungsten or other metal, or the combination of the foregoing. For example, the conductive layer 344 uses TaN as material in the embodiment. The conductive layer 344 can serve as a gate for a transistor. In embodiments that the transistor acts as a memory cell, the conductive layer 344 acts as a word line.

Figure 20A:
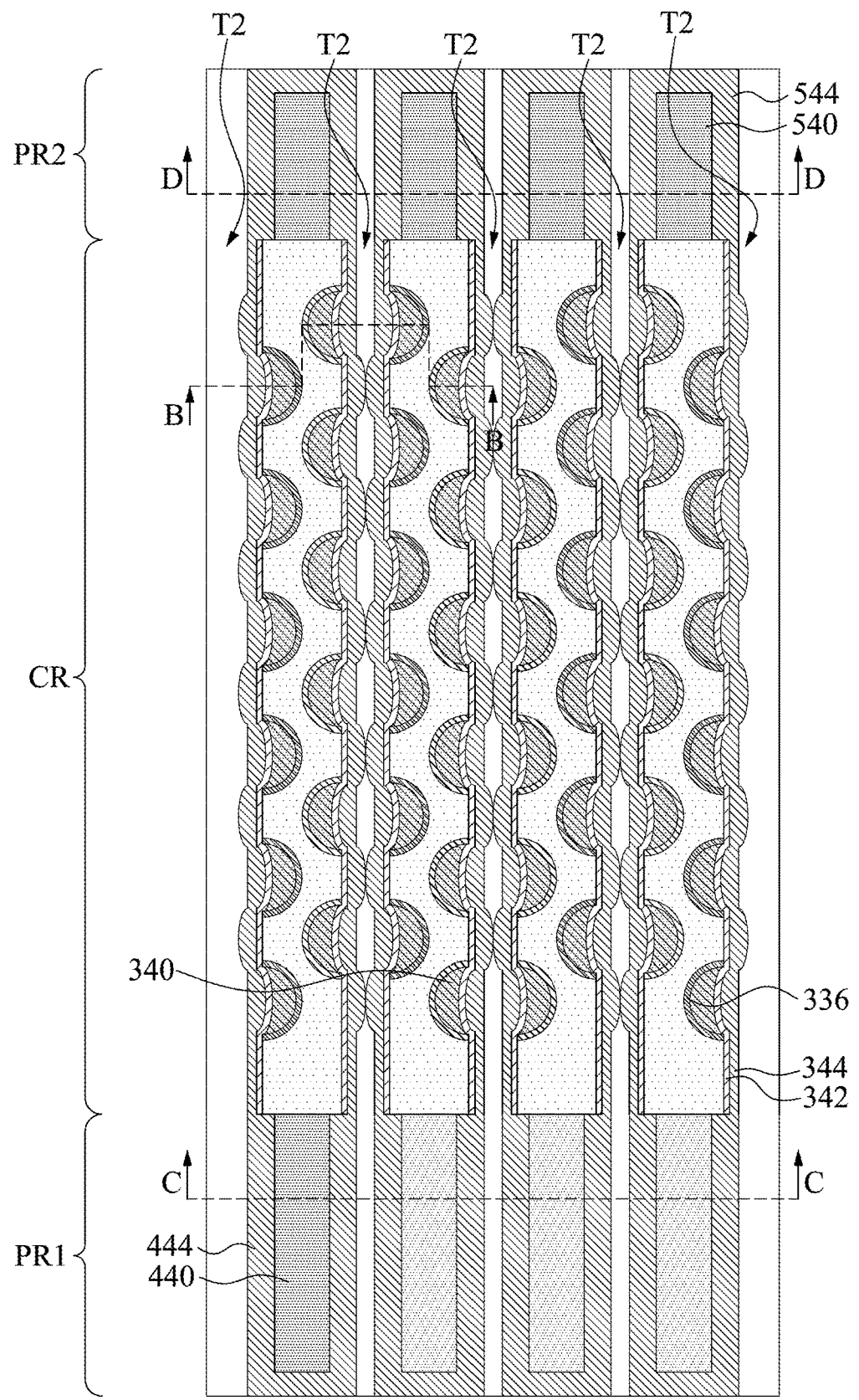
Figure 20B:
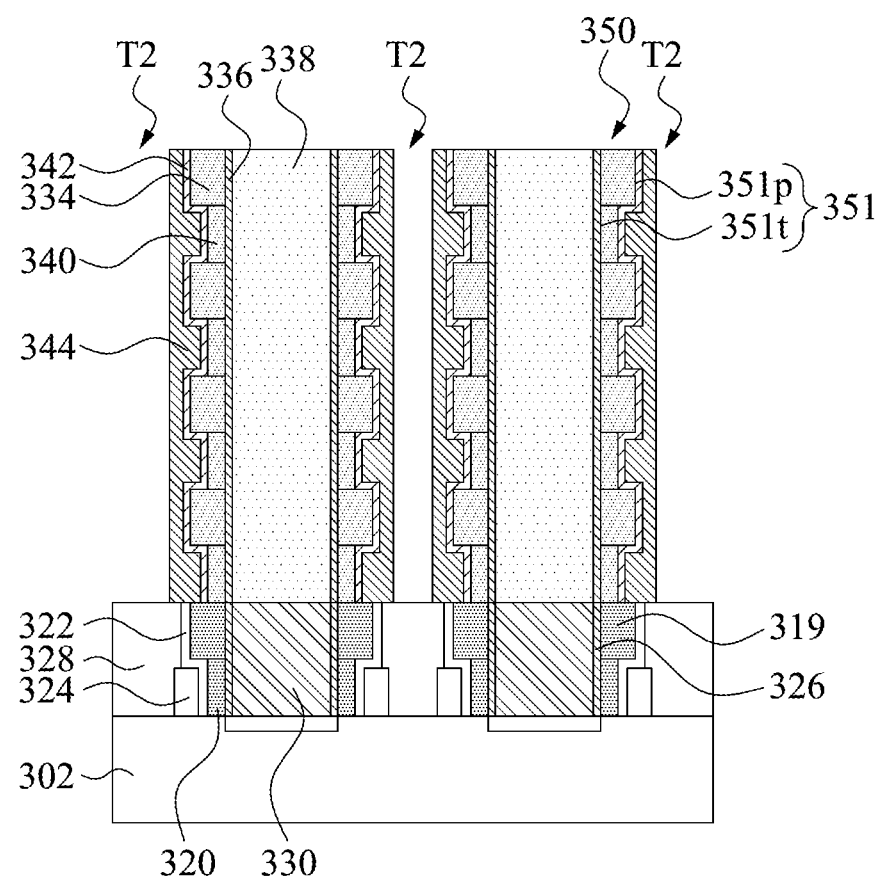
FIG. 20B is a cross-sectional view taken along line B-B of FIG. 20A in accordance with some embodiments of the present disclosure.
Figure 20C:
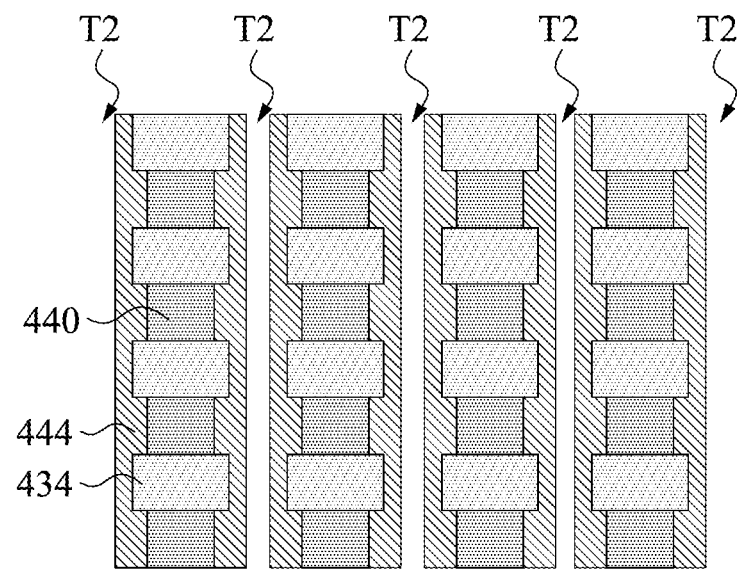
FIG. 20C is a cross-sectional view taken along line C-C of FIG. 20A in accordance with some embodiments of the present disclosure.
Figure 20D:
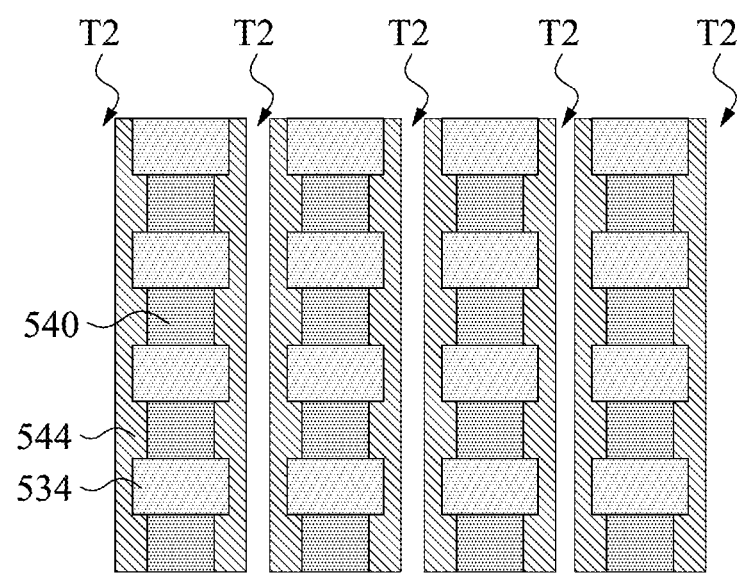
FIG. 20D is a cross-sectional view taken along line D-D of FIG. 20A in accordance with some embodiments of the present disclosure.
Figure 21A:
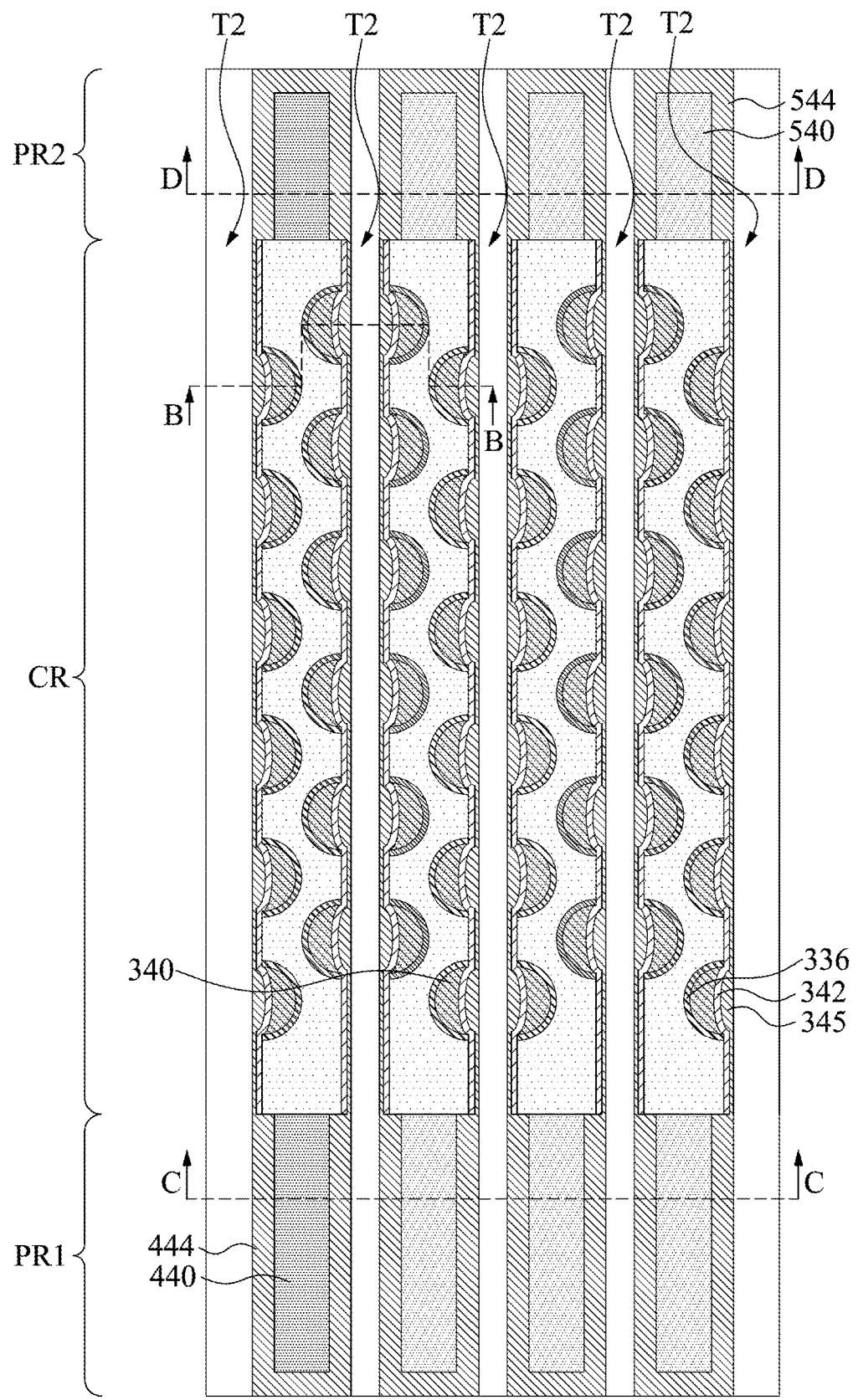
Figure 21B:
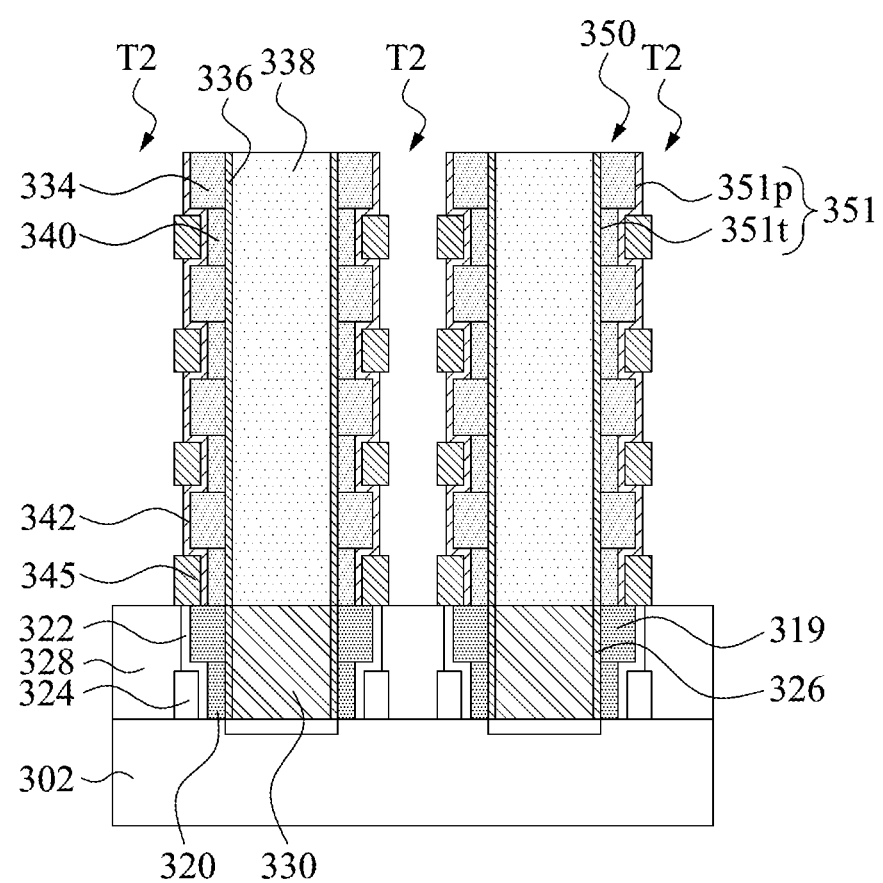
FIG. 21B is a cross-sectional view taken along line B-B of FIG. 21A in accordance with some embodiments of the present disclosure.
Figure 21C:
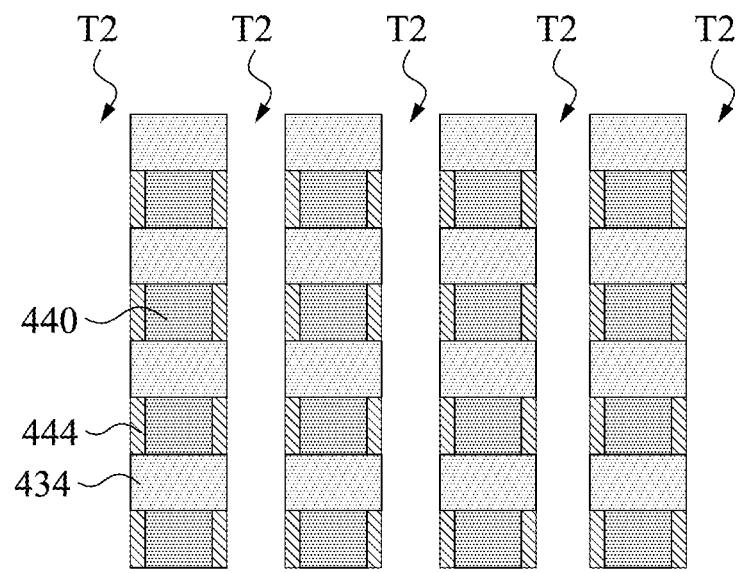
FIG. 21C is a cross-sectional view taken along line C-C of FIG. 21A in accordance with some embodiments of the present disclosure.
Figure 21D:
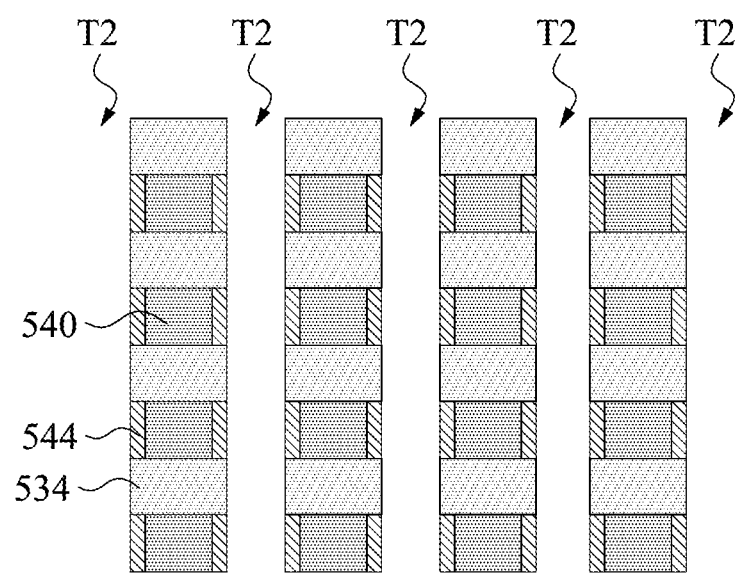
FIG. 21D is a cross-sectional view taken along line D-D of FIG. 21A in accordance with some embodiments of the present disclosure.

Referring to FIG. 20A, depositing the conductive layer 344 also results in depositing the conductive layer 444 wrapping around the fourth polysilicon layer 440 in the peripheral region PR1 to form a U-shaped structure in top view, and depositing the conductive layer 544 wrapping around the fourth polysilicon layer 540 in the peripheral region PR2 to form a reversed U-shaped structure in top view.

Referring to FIGS. 21A to 21D, an DTI etching process is performed such that portions of the conductive layer 344 outside the recesses R1 between vertically neighboring third polysilicon layers 334 are removed, while remaining portions of the conductive layer 344 in the recesses R1 to serve as word lines 345 vertically arranged in an alternating manner with the third polysilicon layers 334 so as to form flash memory cell. In some embodiments, the embedded portions of the word lines 345 are alternatingly arranged with the peaks 351p. In some embodiments, the etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH$:$H_2O_2$:$H_2O$ (APM), $NH_2OH$, KOH, $HNO_3$:$NH_4F$:$H_2O$, and/or the like.

Figure 22A:
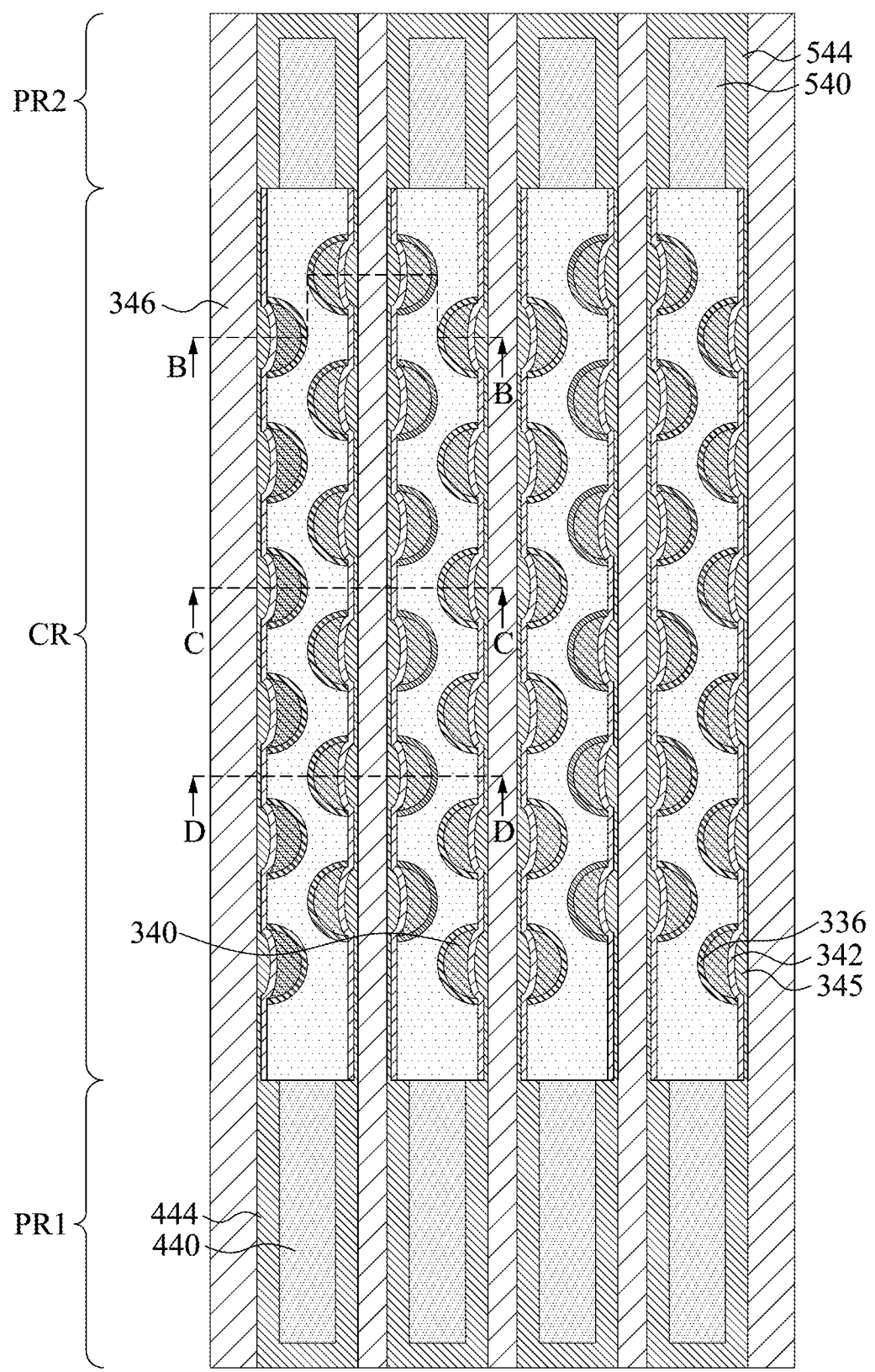
Figure 22B:
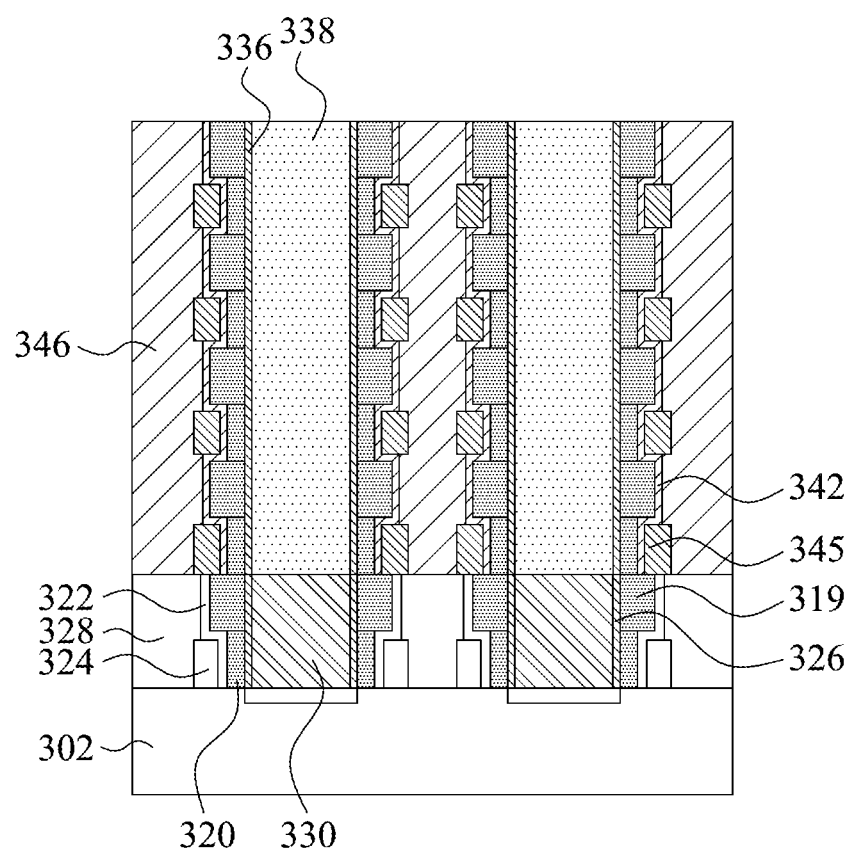
FIG. 22B is a cross-sectional view taken along line B-B of FIG. 22A in accordance with some embodiments of the present disclosure.
Figure 22C:
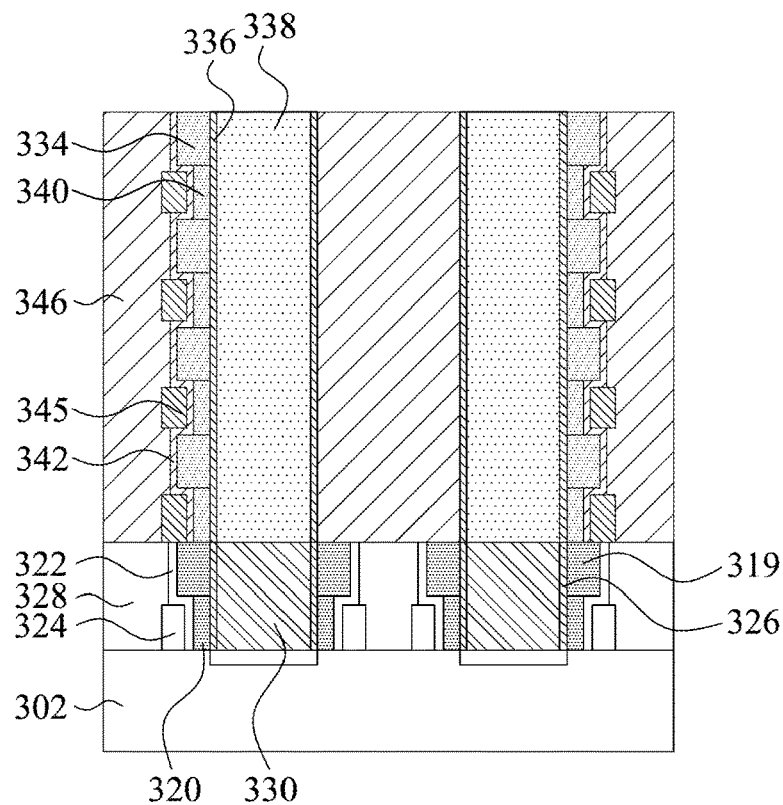
FIG. 22C is a cross-sectional view taken along line C-C of FIG. 22A in accordance with some embodiments of the present disclosure.
Figure 22D:
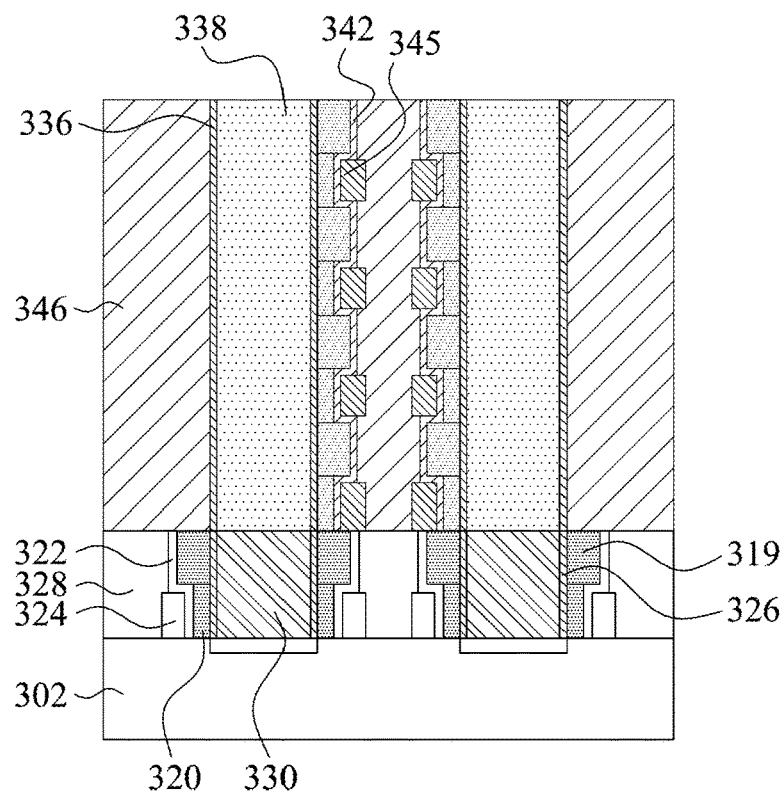
FIG. 22D is a cross-sectional view taken along line D-D of FIG. 22A in accordance with some embodiments of the present disclosure.

Referring to FIGS. 22A and 22B, the trenches T2 are filled with insulating materials to form another second DTI layer 346 in the trenches extending to the peripheral regions PR1 and PR2. The fourth polysilicon layer 340 faces toward the second DTI layer 346. In some embodiments, the second DTI layer 346 may include silicon oxide layer, silicon nitride layer or silicon oxynitride layer, and the like. The second DTI layer 346 may be formed by CVD, PECVD, ALD, or FCVD. A planarization process, such as a CMP process, may be performed to remove excess materials of the second DTI layer 346.

In some embodiments, the fabrication of string selection transistor SST is performed and the fabrication method of string selection transistor SST is the same as ground selection transistor GST (as shown in FIGS. 12A and 12B) by using several STI etching and forming a fifth polysilicon layer (not shown) and a sixth polysilicon layer (not shown). The detail fabrication method of string selection transistor SST is omitted here. Example string selection transistors SST are illustrated in FIG. 9 and discussed previously with respect to FIG. 9.

Figure 23:
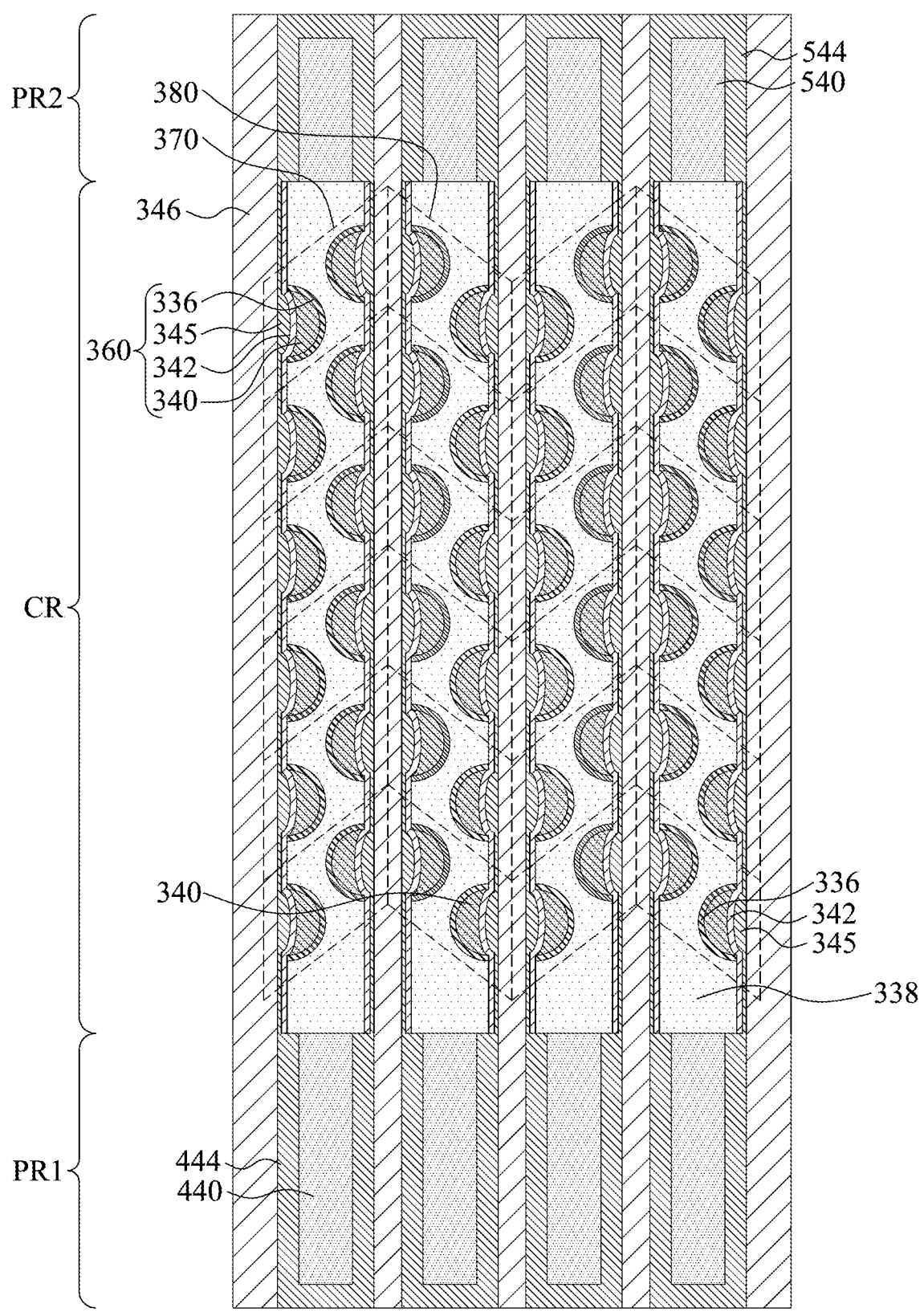

FIG. 23 illustrates a vertical transistor structure and arranges as asymmetrical structure in some embodiments. As shown in FIG. 23, a 3D-NAND flash includes a plurality of FanFET cells 360. Each FanFET cell 360 includes the second liner layers 336, the fourth polysilicon layer 340, the second gate dielectric layer 342, and the word lines 345. Each first unit 370 and each second unit 380 respectively include two FanFET cells 360 which are asymmetrical with each other. In some embodiments, the FanFET cells 360 may arrange asymmetrical with each other so as to improve its structure density. In further embodiments, FanFET may also arrange as compound hexagon (combined with six FanFET cells 360) so as to form the densest structure of FanFET which is called asymmetrical compound hexagon technology (ACHT). It is understood that the 3D-NAND flash is only one exemplary application of the FanFET cells 360 in some embodiments. In other embodiments, the FanFET cells 360 can be used in other applications, such as MRAM, ReRAM (RRAM), NAND, DRAM, NOR, and logic devices with/without specific materials.

Figure 24A:
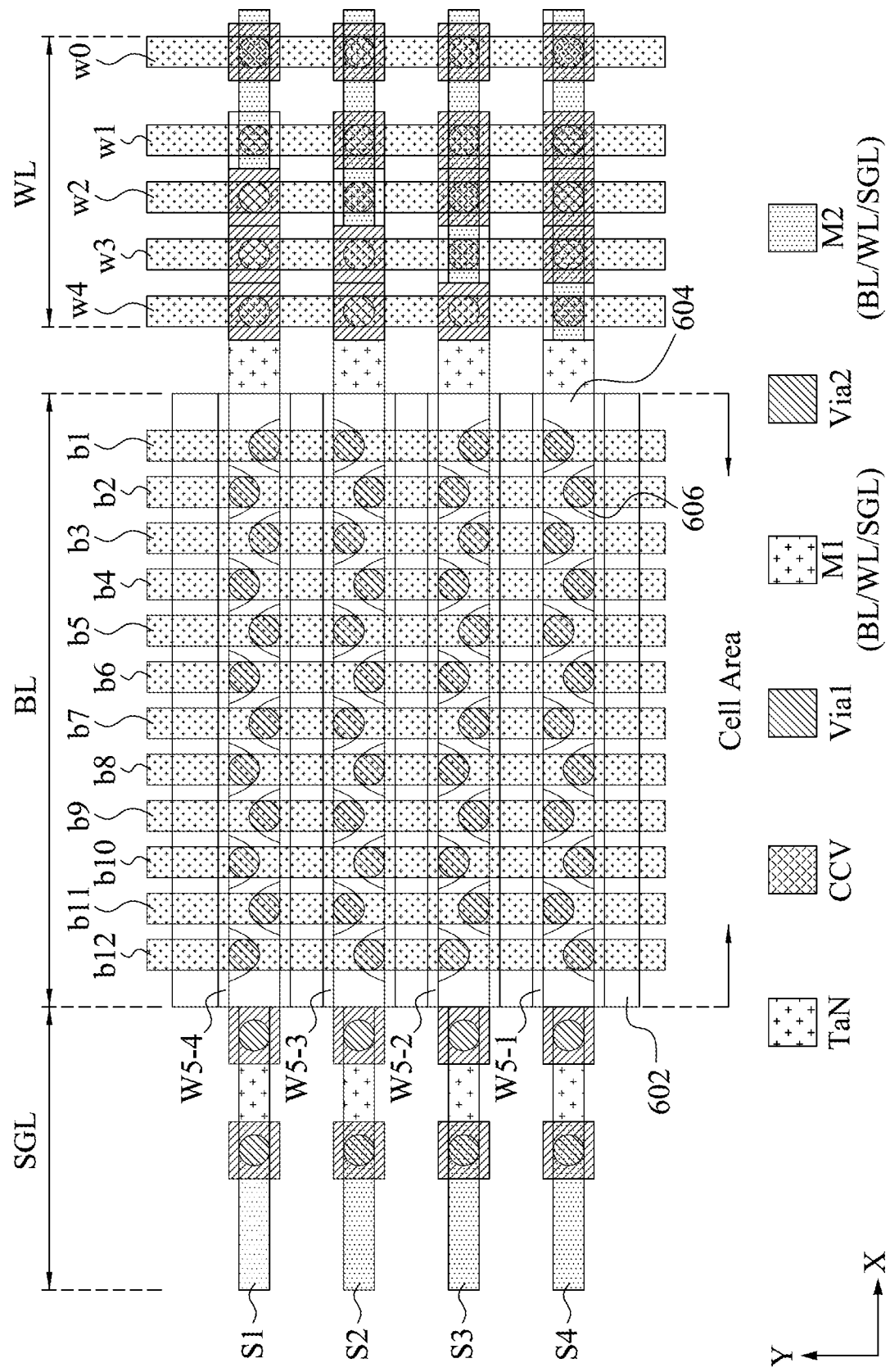
FIG. 24A is a top view of layout of back end of line (BEOL) of memory device in accordance with some embodiments of the present disclosure.
Figure 24B:
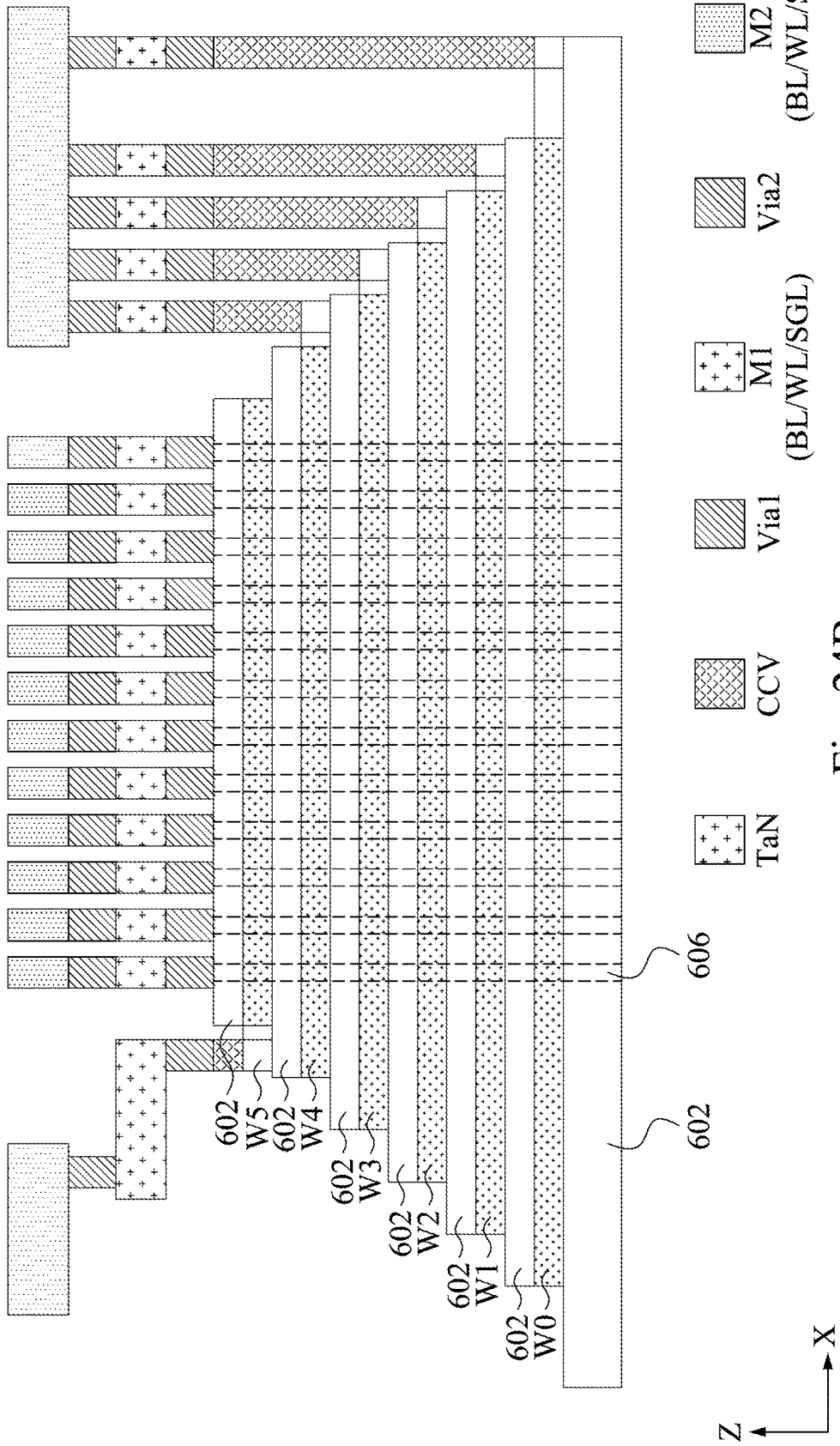
FIG. 24B is a cross-sectional view of memory device of BEOL in accordance with some embodiments of the present disclosure.

FIGS. 24A and 24B are a top view of layout and a cross-sectional view of back end of line (BEOL) of VC type of 3D-NAND flash in accordance with some embodiments of the present disclosure. As illustrated in FIGS. 24A and 24B, the BEOL of VC type of 3D-NAND flash includes a plurality of stripe shaped isolation layers 602, serpentine-shaped isolation layers 604, polysilicon layers 606, word lines (WL) w0 to w5, bit lines (BL) b1 to b12, select gate lines (SGL) s1 to s4, and metal layers M1 and M2. A plurality of word lines are formed on the both side of the serpentine-shaped isolation layers 604. The metal layers M1 and M2 may include a plurality of bit lines, word lines and select gate lines.

A plurality of vias, such as staircase via (also called cascade contact via, CCV), via 1, and via 2, may provide electrical connectivity between the metal layers including BL, WL, and SGL. Referring to FIG. 24A, the via 1 may provide electrical connectivity between SGL and WL. Then metal layer M1 may be designed as BL, for example, bit line b5. The via 1 may provide electrical connectivity between the metal layers including BL, WL, and SGL. For example, the via 1 may provide electrical connectivity between metal layer M1 and WL. The via 2 may also provide electrical connectivity between the metal layers including BL, WL, and SGL. For example, the via 2 may provide electrical connectivity between the metal layer M2 and WL.

Referring to FIG. 24B, the cascade contact via CCV may electrically connect from WL to via 1 of the metal layer M1, and then electrically connect to the metal layer M2 through via 2. For example, the uppermost word line w5 may electrically connect to the metal layer M1 through the cascade contact via CCV and via 1, and then electrically connect to SGL of the metal layer M2 through via 2.

In some embodiments, copper process BEOL of VC type of 3D-NAND flash is similar to the BEOL process as shown in FIGS. 24A and 24B. The cascade contact via CCV may electrically connect between SGL and WL. The double damascene (DD1) may include via 1 and the metal layer M1. Another double damascene (DD2) may include via 2 and the metal layer M2.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A method of forming a memory device, comprising:
    forming a stack of silicon nitride layers and polysilicon layers that are alternatingly arranged;
    etching a serpentine trench in the stack of silicon nitride layers and polysilicon layers;
    forming a first isolation layer in the serpentine trench;
    removing one of the silicon nitride layers to form a recess between neighboring two of the polysilicon layers; and
    forming in sequence a doped polysilicon layer, a gate dielectric layer and a conductive layer in the recess.

2. The method of claim 1, further comprising:
    etching a stripe-shaped trench in the stack of silicon nitride layers and polysilicon layers; and
    forming a second isolation layer in the stripe-shaped trench after forming the doped polysilicon layer, the gate dielectric layer and the conductive layer.

3. The method of claim 2, wherein forming a second isolation layer in the stripe-shaped trench, such that the doped polysilicon layer faces toward the second isolation layer.

4. The method of claim 1, wherein forming the conductive layer is performed such that a first portion of the conductive layer and a second portion of the conductive layer wrap around the doped polysilicon layer in top view, and the first isolation layer is between the first portion and the second portion of the conductive layer in top view.

5. The method of claim 1, wherein forming the doped polysilicon layer, the gate dielectric layer and the conductive layer in the recess, such that the doped polysilicon layer has a semi-elliptical profile in top view.

6. The method of claim 1, wherein a conductive layer is formed as embedded in the gate dielectric layer.

* * * * *